(12) United States Patent
ur Rahman et al.

(10) Patent No.: US 11,334,109 B1
(45) Date of Patent: May 17, 2022

(54) VARIABLE-LENGTH CLOCK STRETCHER WITH COMBINER TIMING LOGIC

(71) Applicant: SambaNova Systems, Inc., Palo Alto, CA (US)

(72) Inventors: Fahim ur Rahman, Sunnyvale, CA (US); Mahmood Khayatzadeh, Belmont, CA (US); Zuxu Qin, Palo Alto, CA (US); Jin-uk Shin, San Jose, CA (US)

(73) Assignee: SambaNova Systems, Inc., Palo Alto, CA (US)

( * ) Notice: Subject to any disclaimer, the term of this patent is extended or adjusted under 35 U.S.C. 154(b) by 0 days.

(21) Appl. No.: 17/405,913

(22) Filed: Aug. 18, 2021

Related U.S. Application Data

(60) Provisional application No. 63/195,664, filed on Jun. 1, 2021.

(51) Int. Cl.
| | |
|---|---|
| *G06F 1/08* | (2006.01) |
| *H03K 5/01* | (2006.01) |
| *H03K 3/037* | (2006.01) |
| *H03K 19/20* | (2006.01) |
| *H03K 5/00* | (2006.01) |

(52) U.S. Cl.
CPC ............ *G06F 1/08* (2013.01); *H03K 3/037* (2013.01); *H03K 5/01* (2013.01); *H03K 19/20* (2013.01); *H03K 2005/00013* (2013.01)

(58) Field of Classification Search
None
See application file for complete search history.

(56) References Cited

U.S. PATENT DOCUMENTS

| | | | |
|---|---|---|---|
| 3,517,300 A | 6/1970 | McMurray | |
| 5,947,093 A | 9/1999 | Ward | |
| 6,608,528 B2 | 8/2003 | Tam et al. | |
| 6,628,276 B1 | 9/2003 | Elliott | |
| (Continued) | | | |

FOREIGN PATENT DOCUMENTS

WO  2010142987 A1  12/2010

OTHER PUBLICATIONS

U.S. Appl. No. 17/338,626—Office Action dated Oct. 5, 2021, 10 pages.

(Continued)

*Primary Examiner* — Cassandra F Cox
(74) *Attorney, Agent, or Firm* — Haynes Beffel & Wolfeld LLP; Andy Grouwstra

(57) ABSTRACT

A clock stretcher includes a delay line, a control unit, and a combiner. The delay line outputs a series of delayed phases of an input clock. The control circuit is clocked by the input clock. It outputs a series of delayed phase enable signals. The combiner circuit receives the delayed phases from the delay line and the delayed phase enable signals from the control circuit, and outputs a modified clock. The control circuit determines if stretching has started, if wraparound must occur, and if a next phase must be enabled. The combiner retimes a delayed phase enable signal for a first delayed phase using a flipflop clocked by a second delayed phase to generate a retimed phase enable signal. The combiner uses the retimed phase enable signal to pass a pulse of the first delayed phase to the output as a pulse of the modified clock.

8 Claims, 18 Drawing Sheets

(56) References Cited

U.S. PATENT DOCUMENTS

| | | |
|---|---|---|
| 6,826,247 B1 | 11/2004 | Elliott et al. |
| 6,891,303 B2 | 5/2005 | Leijon et al. |
| 6,922,111 B2 | 7/2005 | Kurd et al. |
| 7,675,332 B1 | 3/2010 | Kwasniewski et al. |
| 7,688,150 B2 | 3/2010 | Kurd et al. |
| 7,724,078 B2 | 5/2010 | Kurd et al. |
| 7,821,312 B1 | 10/2010 | Zheng |
| 7,929,498 B2 | 4/2011 | Ozluturk et al. |
| 8,933,737 B1 | 1/2015 | Chatterjee et al. |
| 9,065,321 B2 | 6/2015 | Divan et al. |
| 9,413,344 B2 | 8/2016 | Bowman et al. |
| 9,444,275 B2 | 9/2016 | Huang et al. |
| 9,806,701 B1 | 10/2017 | Bellaouar et al. |
| 10,009,016 B1 | 6/2018 | Ho et al. |
| 10,063,158 B1 | 8/2018 | Li et al. |
| 10,069,430 B2 | 9/2018 | Sahoo et al. |
| 10,348,281 B1 | 7/2019 | Oliver et al. |
| 10,409,317 B2 | 9/2019 | Saint-Laurent et al. |
| 10,425,088 B2 | 9/2019 | Muench et al. |
| 10,425,089 B2 | 9/2019 | Kosonocky et al. |
| 10,587,250 B2 | 3/2020 | Hanke et al. |
| 10,587,253 B1 | 3/2020 | Huang et al. |
| 10,686,582 B1 | 6/2020 | Pasdast et al. |
| 10,901,018 B2 | 1/2021 | Sugumar et al. |
| 10,924,121 B1 | 2/2021 | Abuellil et al. |
| 10,996,738 B2 | 5/2021 | Sugumar et al. |
| 11,021,069 B1 | 6/2021 | Elshaer et al. |
| 2003/0179842 A1 | 9/2003 | Kane et al. |
| 2004/0119521 A1 | 6/2004 | Kurd et al. |
| 2004/0227560 A1 | 11/2004 | de Buda |
| 2005/0111246 A1 | 5/2005 | Lai et al. |
| 2007/0127182 A1 | 6/2007 | Chang et al. |
| 2007/0210842 A1 | 9/2007 | Kawamoto |
| 2009/0168942 A1 | 7/2009 | Choi et al. |
| 2009/0224807 A1 | 9/2009 | Philippe |
| 2009/0225569 A1 | 9/2009 | Begalke |
| 2010/0036211 A1 | 2/2010 | La Rue et al. |
| 2010/0194456 A1 | 8/2010 | Kang et al. |
| 2011/0221495 A1 | 9/2011 | Lee et al. |
| 2012/0120697 A1 | 5/2012 | Cuk |
| 2012/0139592 A1 | 6/2012 | Bo et al. |
| 2012/0187991 A1 | 7/2012 | Sathe et al. |
| 2012/0319483 A1 | 12/2012 | Scruggs et al. |
| 2013/0051102 A1 | 2/2013 | Huang et al. |
| 2013/0201733 A1 | 8/2013 | Divan et al. |
| 2013/0287065 A1 | 10/2013 | Sun et al. |
| 2014/0009189 A1 | 1/2014 | Mauder et al. |
| 2014/0340132 A1 | 11/2014 | Terrovitis |
| 2014/0362952 A1 | 12/2014 | Cheng et al. |
| 2015/0229227 A1 | 8/2015 | Aeloiza et al. |
| 2015/0280595 A1 | 10/2015 | White |
| 2015/0365003 A1 | 12/2015 | Sadwick |
| 2016/0241137 A1 | 8/2016 | Sun et al. |
| 2017/0099008 A1 | 4/2017 | Keister et al. |
| 2017/0331387 A1 | 11/2017 | Gougerchian |
| 2017/0346414 A1 | 11/2017 | Mondal |
| 2018/0198377 A1 | 7/2018 | Keister et al. |
| 2018/0267480 A1 | 9/2018 | Mahajan et al. |
| 2018/0309456 A1 | 10/2018 | Grollitsch |
| 2018/0358814 A1 | 12/2018 | Rates Palau et al. |
| 2019/0280586 A1 | 9/2019 | Chen et al. |
| 2019/0296634 A1 | 9/2019 | Ikeda |
| 2019/0312521 A1 | 10/2019 | Cao et al. |
| 2019/0326280 A1 | 10/2019 | Imam et al. |
| 2019/0334529 A1* | 10/2019 | Huang .................... H03L 7/181 |
| 2019/0361485 A1 | 11/2019 | Kosonocky |
| 2020/0059190 A1 | 2/2020 | Kim |
| 2020/0350919 A1* | 11/2020 | Marcu .................... H03L 7/099 |
| 2021/0013743 A1 | 1/2021 | Hu et al. |
| 2021/0044233 A1 | 2/2021 | Glose et al. |
| 2021/0091767 A1 | 3/2021 | Cairoli et al. |
| 2021/0135588 A1 | 5/2021 | Prasad et al. |
| 2021/0250030 A1 | 8/2021 | Abuellil et al. |
| 2021/0250031 A1 | 8/2021 | Abuellil et al. |

OTHER PUBLICATIONS

U.S. Appl. No. 17/338,625 Notice of Allowance, dated Sep. 16, 2021, 18 pages.

U.S. Appl. No. 17/338,629 First Office Action, dated Oct. 5, 2021,10 pages.

U.S. Appl. No. 17/338,626—Response to Office Action dated Oct. 5, 2021, filed Oct. 12, 2021, 09 pages.

U.S. Appl. No. 17/338,629 Response to First Office Action dated Oct. 5, 2021, filed Oct. 14, 2021, 10 pages.

Podobas et al, A Survey on Coarse-Grained Reconfigurable Architectures From a Performance Perspective, IEEEAccess, vol. 2020. 3012084, Jul. 27, 2020, 25 pages.

M. Emani et al., "Accelerating Scientific Applications With SambaNova Reconfigurable Dataflow Architecture," in Computing in Science & Engineering, vol. 23, No. 2, pp. 114-119, Mar. 1-Apr. 2021, doi: 10.1109/MCSE.2021.3057203.

* cited by examiner

FIG. 13 – Finite DLL Bandwidth Glitch Correction

FIG. 14 – Finite DLL Bandwidth Glitch Correction

FIG. 15 – Correction of Phase Detector Offset Glitches

FIG. 16 – Correction of Phase Detector Offset Glitches

FIG. 17 – Digital DLL Glitch Correction

FIG. 18 – Passive Mode Jitter Reduction

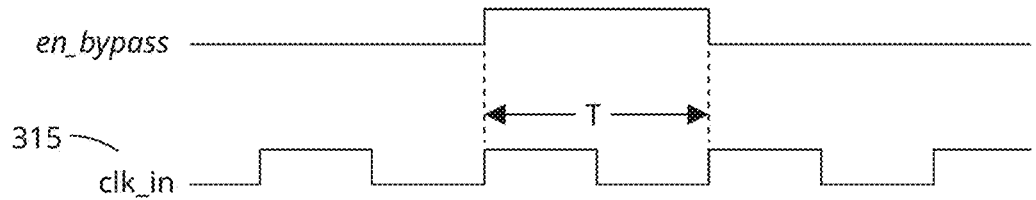
FIG. 21 – Over-critical timing
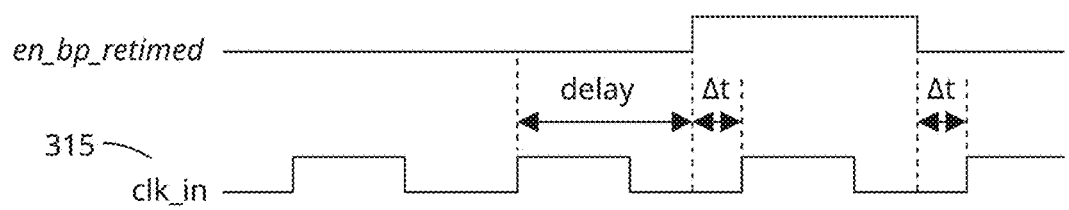
FIG. 22 – Safe timing
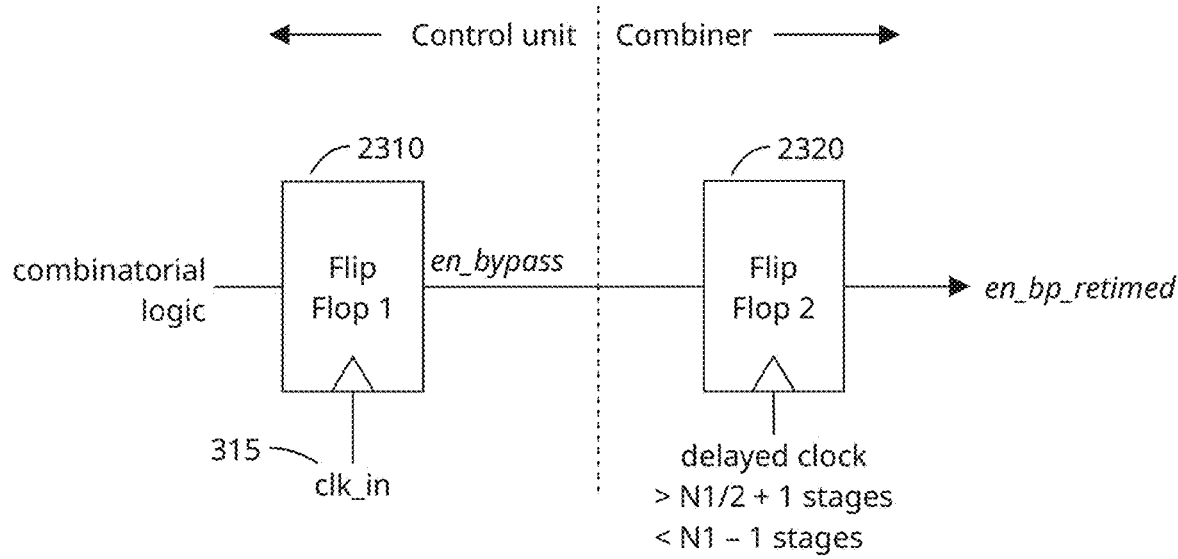
FIG. 23 – Direct retimer

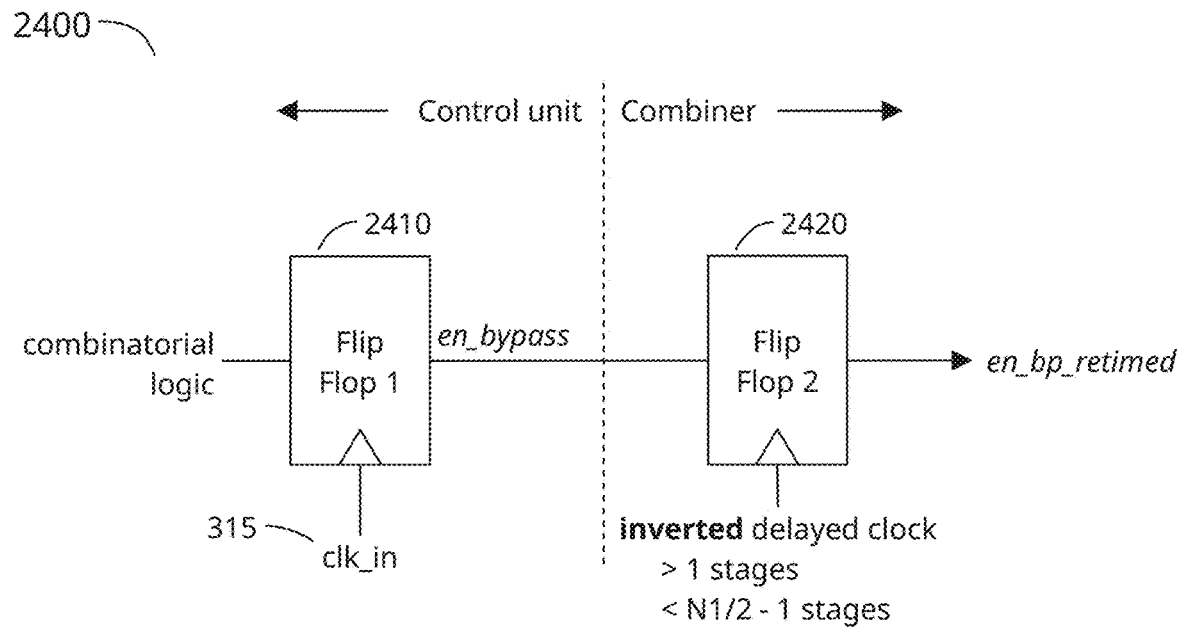
FIG. 24 – Indirect retimer
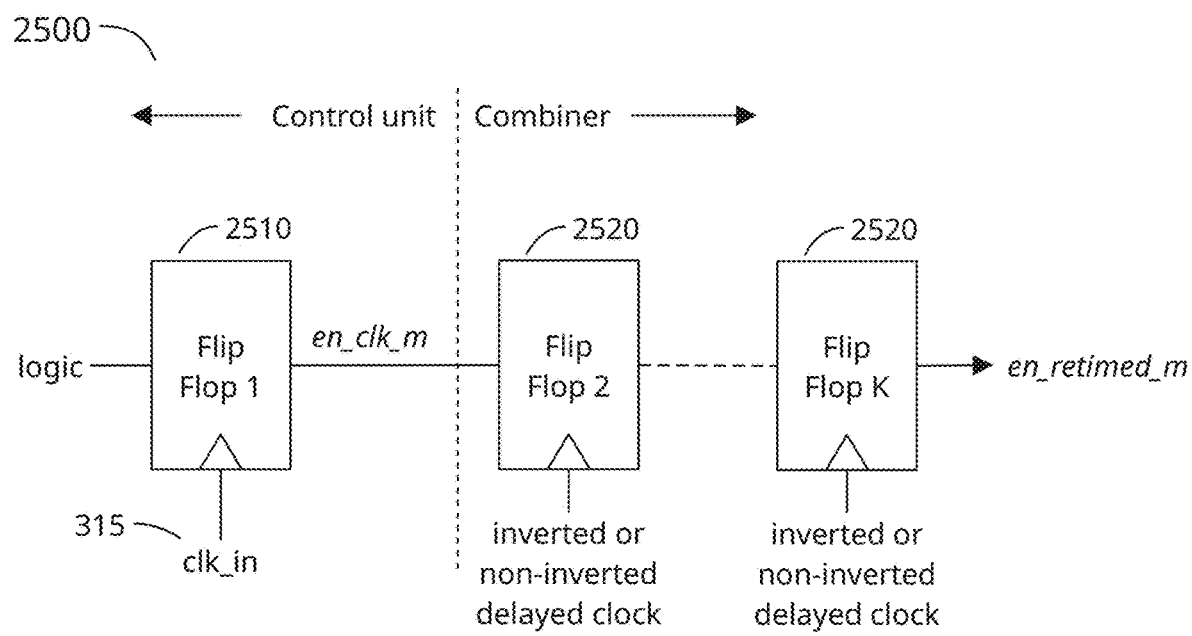
FIG. 25 – Hybrid retimer

2600

FIG. 26 – Example retimer

| IN | OUT | FF2 | FF3 | FF4 | FF5 |
|---|---|---|---|---|---|
| en_clk_0 | en_retimed_0 | clk_3 | n/a | n/a | n/a |
| en_clk_1 | en_retimed_1 | clk_3 | n/a | n/a | n/a |
| en_clk_2 | en_retimed_2 | clk_5 | clk_5 | n/a | n/a |
| en_clk_3 | en_retimed_3 | clk_5 | clk_5 | n/a | n/a |
| en_clk_4 | en_retimed_4 | clk_7 | clk_7 | n/a | n/a |
| en_clk_5 | en_retimed_5 | clk_7 | clk_7 | n/a | n/a |
| en_clk_6 | en_retimed_6 | clk_in | clk_1 | n/a | n/a |
| en_clk_7 | en_retimed_7 | clk_in | clk_1 | n/a | n/a |
| en_clk_8 | en_retimed_8 | clk_in | clk_3 | n/a | n/a |
| en_clk_9 | en_retimed_9 | clk_in | clk_3 | n/a | n/a |
| en_clk_10 | en_retimed_10 | clk_11 | clk_5 | n/a | n/a |
| en_clk_11 | en_retimed_11 | clk_11 | clk_5 | n/a | n/a |
| en_clk_12 | en_retimed_12 | clk_9 | clk_17 | clk_7 | n/a |
| en_clk_13 | en_retimed_13 | clk_9 | clk_17 | clk_7 | n/a |
| en_clk_14 | en_retimed_14 | clk_9 | clk_17 | clk_9 | n/a |
| en_clk_15 | en_retimed_15 | clk_9 | clk_17 | clk_9 | n/a |
| en_clk_16 | en_retimed_16 | clk_9 | clk_17 | clk_11 | n/a |
| en_clk_17 | en_retimed_17 | clk_9 | clk_17 | clk_11 | n/a |
| en_clk_18 | en_retimed_18 | clk_9 | clk_19 | clk_13 | n/a |
| en_clk_19 | en_retimed_19 | clk_9 | clk_19 | clk_13 | n/a |
| en_clk_20 | en_retimed_20 | clk_9 | clk_21 | clk_15 | n/a |
| en_clk_21 | en_retimed_21 | clk_9 | clk_21 | clk_15 | n/a |
| en_clk_22 | en_retimed_22 | clk_11 | clk_23 | clk_17 | n/a |
| en_clk_23 | en_retimed_23 | clk_11 | clk_23 | clk_17 | n/a |
| en_clk_24 | en_retimed_24 | clk_13 | clk_25 | clk_19 | n/a |
| en_clk_25 | en_retimed_25 | clk_13 | clk_25 | clk_19 | n/a |
| en_clk_26 | en_retimed_26 | clk_7 | clk_19 | clk_27 | clk_21 |
| en_clk_27 | en_retimed_27 | clk_7 | clk_19 | clk_27 | clk_21 |
| en_clk_28 | en_retimed_28 | clk_7 | clk_19 | clk_29 | clk_23 |
| en_clk_29 | en_retimed_29 | clk_7 | clk_19 | clk_29 | clk_23 |
| en_clk_30 | en_retimed_30 | clk_7 | clk_19 | clk_31 | clk_25 |
| en_clk_31 | en_retimed_31 | clk_7 | clk_19 | clk_31 | clk_25 |

US 11,334,109 B1

VARIABLE-LENGTH CLOCK STRETCHER WITH COMBINER TIMING LOGIC

CROSS-REFERENCE

This application claims the benefit of U.S. Provisional Patent Application No. 63/195,664, entitled, "Variation-tolerant variable-length clock-stretcher module with in-situ end-of-chain detection mechanism," filed on Jun. 1, 2021. The priority application is hereby incorporated by reference herein for all purposes.

RELATED APPLICATION(S)

This application is related to the following commonly owned applications:

U.S. patent application Ser. No. 17/338,620, entitled "Variable-Length Clock Stretcher with Correction for Glitches Due to Finite DLL Bandwidth," filed Jun. 3, 2021;

U.S. patent application Ser. No. 17/338,625, entitled "Variable-Length Clock Stretcher with Correction for Glitches Due to Phase Detector Offset," filed Jun. 3, 2021;

U.S. patent application Ser. No. 17/338,626, entitled "Variable-Length Clock Stretcher with Correction for Digital DLL Glitches," filed Jun. 3, 2021; and U.S. patent application Ser. No. 17/338,629, entitled "Variable-Length Clock Stretcher with Passive Mode Jitter Reduction," filed Jun. 3, 2021.

The related application(s) are hereby incorporated by reference herein for all purposes.

BACKGROUND

Technical Field

The disclosed implementations relate generally to systems and methods used in clocking electronics, and in particular to those for adaptively clocking circuits with a variable load.

Context

Unless otherwise indicated herein, elements described in this section are not prior art to the claims and are not admitted being prior art by inclusion in this section.

Processing Units (CPUs), processors for Artificial Intelligence (AI) applications, and other clocked digital electronics may be implemented as systems on a chip (SoCs), often requiring a large amount of power to operate. Based on the overall processing requirements, and possibly software being executed, the instantaneous load on the supply power can vary sharply, which may result in sharp changes in the supply voltage. A droop in the supply voltage may slow down electronic circuits, and a peak may increase their speed. Both droops and peaks may therefore impact the operation of a processor. Especially droops may result in timing violations when a digital circuit operates from a clock whose frequency is too high for the current supply voltage and, consequently, the digital circuit may fail functionally. Even a single clock pulse that is too short must be considered a glitch that can result in timing violations and a functional failure. In general, a processor has a maximum clock frequency that depends on the supply voltage available. Thus, a clock for a processor operating at its maximum clock frequency may need to be slowed down when the processor supply voltage decreases. One system that can do so is a clock stretcher, which can stretch the length of one or more successive clock pulses to temporarily slow down a clock.

However, conventional clock stretchers require a clean supply themselves. They often employ a delay line whose delay directly depends on the supply voltage. Conventional solutions embed the delay line with a phase detector in an analog delay-locked loop (DLL), a negative feedback loop that counters the influence of the supply voltage on the delay. To ensure stability, the DLL feedback loop is designed with a limited bandwidth, and the DLL cannot keep up with supply voltage changes that are too fast. Conventionally, the delay line must have a high resolution, which increases power consumption and die area, and limits the clock frequency range. DLL phase detector offset can introduce further inaccuracies. Unfortunately, modern semiconductor fabrication processes make it difficult to design a phase detector with a low offset. An analog DLL is very dependent on having a dedicated clean power supply. This can be overcome by using a digital DLL, but a digital DLL operates in discrete time steps, which may cause a shortened clock pulse at the time of a DLL adjustment. The shortened clock pulse may cause timing violations and functional failure.

When a clock stretcher is integrated with a powerful processor, or other electronic system with sharply variable load, a clean supply may be expensive or not be readily available. Implementations of the disclosed technology address several of the problems that may occur due to polluted supply voltages and due to using a digital DLL.

SUMMARY

Central Processing Units (CPUs), processors for Artificial Intelligence (AI) applications, and other clocked systems may be implemented as large systems on a chip (SoCs), requiring large power to operate. Based on the overall processing requirement, and software being executed, the instantaneous load on the supply power can vary sharply, which may result in sudden changes in the supply voltage. A droop in the supply voltage may slow down electronic circuits, and result in timing violations and functional failures. In general, a processor has a maximum clock frequency that depends on the available supply voltage. Thus, a clock for a processor operating at or near its maximum clock frequency may need to be slowed down when the processor supply voltage decreases.

Implementations of the disclosed technology provide a clock stretcher that is operable to receive an input clock signal whose frequency is fixed and to output a modified clock signal whose frequency is equal to or lower than the received frequency, based on one or more sensed conditions. The sensed conditions may include the voltage of supplied power. The clock stretcher may include a sense unit for sensing the condition, a delay-locked loop (DLL) for deriving a series of delayed versions of the input clock signal (delayed phases), a combiner for selecting one or more of the delayed phases, and a control unit that receives information from the sense unit and the DLL and controls the DLL and the combiner to generate the modified clock as required. Implementations may operate from the supplied power without intervening voltage regulation.

The clock stretcher receives an input clock clk_in which may have a fixed frequency. The clock stretcher generates a stretched clock, with a lower frequency, by regularly skipping an input clock pulse, and repositioning (retiming) the remaining clock pulses so that they appear at regular intervals. To reposition these remaining clock pulses, the clock stretcher uses the DLL delay line, which outputs N successively delayed phases φ0 . . . φN−1, and the combiner, which cyclically selects pulses of the output signal from the delayed phases, using the hop code which determines the cyclical step size. The combiner is controlled by a control unit or control circuit, that is clocked by the input clock. Since the clock stretcher regularly skips a pulse from the input clock, not all input clock pulses map to output clock pulses. Thus, the skipped pulses are dead pulses. The combiner receives its phase selection information from the control unit, in synchronization with the input clock. However, the output clock pulses generally trail the input clock pulses, so the phase selection information has to be retimed. A phase enable signal also needs to start before a pulse with a delayed phase arrives, and it needs to end before a next pulse with a delayed phase arrives. Thus, the clock stretcher's combiner includes a retimer to ensure the integrity of output clock pulses.

In a first aspect of the disclosed technology, an implementation provides a method to determine enablement of a next delay phase in the clock stretcher. The clock stretcher receives an input clock pulse with a clock cycle time T on an input and delivers a pulse of a modified clock on an output by enabling the next delayed phase. The method includes the following steps, as also shown in FIG. 27.

The method starts (a)/Step 2710 with determining if stretching has started. If not so, (b)/Step 2720 it initializes a parameter waw_l to false, and loops back to Step (a)/Step 2710. If stretching has started, (c)/Step 2730 it sets a parameter waw to equal the parameter waw_l. In Step (d)/Step 2740, it determines if a wraparound must occur. If not so (Step 2750), it sets the parameter waw_l to false and proceeds to Step (g)/Step 2760. If so (Step 2755), it sets the parameter waw to an inverse of the parameter waw and proceeds to Step (h)/Step 2765.

In Step (g)/Step 2760, it determines if the parameter waw equals true. If not, it proceeds to Step (i)/Step 2770. If yes, it proceeds to Step (k)/Step 2780. In Step (h)/Step 2765, it determines if the parameter waw equals true. If not, it proceeds to Step (j)/Step 2775. If yes, it proceeds to Step (k)/Step 2780.

In Step (i)/Step 2770, it determines an index of the next phase without wraparound, enabling the next phase to deliver the pulse of the modified clock on the output, and returns to Step (a)/Step 2710 for a next pulse of the input clock. In Step (j)/Step 2775, it determines an index of the next phase with wraparound, enabling the next phase to deliver the pulse of the modified clock on the output, and returns to Step (a)/Step 2710 for a next pulse of the input clock. In Step (k)/Step 2780, it wraps around phase selection and returns to Step (a)/Step 2710 for a next pulse of the input clock without forwarding the current pulse to the output— the current pulse becomes a dead pulse.

In a second aspect of the disclosed technology, an implementation provides a clock stretcher with a combiner. The combiner comprises a retimer and combinatorial logic. The retimer has a first input for a bypass enable signal and second inputs for phase enable signals, a first output for a retimed bypass enable signal and second outputs for retimed phase enable signals. The combinatorial logic has a first input for the retimed bypass enable signal, coupled with the retimer first output, second inputs for the retimed phase enable signals coupled with the retimer second outputs, a third input for an input clock signal, fourth inputs for delayed phase signals, and an output for a modified clock signal.

Upon receiving the retimed bypass enable signal, the combinatorial logic passes the input clock signal to the output for the modified clock signal. And upon receiving a retimed phase enable signal, the combinatorial logic passes a delayed phase signal to the output for the modified clock signal.

The retimer comprises a bypass flipflop with a data input coupled with the first retimer input, a data output coupled with the first retimer output, and a clock input coupled with a combinatorial logic fourth input to receive a delayed phase signal that triggers the bypass flipflop.

The retimer may further comprise a series of flipflops, each with a data input, a data output, and a clock input. A first flipflop data input is coupled with a second retimer input to receive a phase enable signal and a last flipflop data output is coupled with a second retimer output to deliver a retimed phase enable signal. Each flipflop in the series of flipflops has its clock input coupled with a combinatorial logic fourth input to receive a delayed phase signal that triggers the flipflop.

In a third aspect of the disclosed technology, an implementation provides a clock stretcher circuit. It includes a delay line, a control circuit, and a combiner circuit. The delay line outputs a series of delayed phases of a input clock. The control circuit is clocked by the input clock. It outputs a series of delayed phase enable signals. The combiner circuit receives the series of delayed phases from the delay line and the series of delayed phase enable signals from the control circuit, and outputs a modified clock. The control circuit determines if stretching has started, if wraparound must occur, and if a next phase must be enabled. The combiner retimes a delayed phase enable signal for a first delayed phase using a flipflop clocked by a second delayed phase to generate a retimed phase enable signal. The combiner uses the retimed phase enable signal to pass a pulse of the first delayed phase to the output as a pulse of the modified clock.

Particular aspects of the technology disclosed are described in the claims, specification and drawings.

BRIEF DESCRIPTION OF THE DRAWINGS

The disclosed technology will be described with reference to the drawings, in which:

FIG. 21 illustrates an example of over-critical timing of the signal that enables the input clock to bypass the DLL;

FIG. 22 illustrates an example of safe timing of the signal that enables the input clock to bypass the DLL;

FIG. 23 illustrates an example direct retimer circuit to generate a retimed bypass enable signal according to an implementation of the disclosed technology;

FIG. 24 illustrates an example indirect retimer circuit to generate a retimed bypass enable signal according to an implementation of the disclosed technology;

FIG. 25 illustrates an example hybrid retimer to generate any retimed signal needed in an implementation;

FIG. 26 illustrates an example table with retiming parameters used in an implementation of the disclosed technology.

Figure 1:
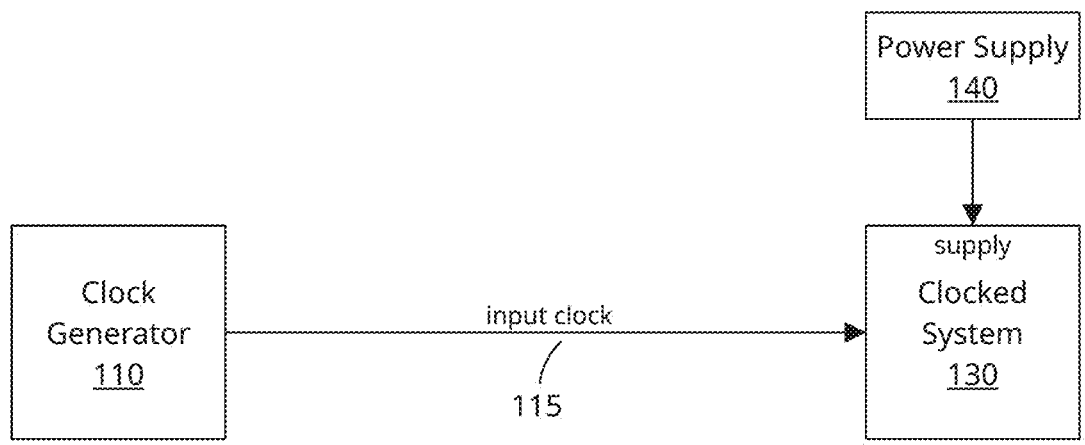
FIG. 1 illustrates a conventional clocked system using a input clock.

In the figures, like reference numbers may indicate functionally similar elements. The systems and methods illustrated in the figures, and described in the Detailed Description below, may be arranged and designed in a wide variety of different implementations. Neither the figures, nor the Detailed Description, are intended to limit the scope as claimed. Instead, they merely represent examples of different implementations of the disclosed technology.

DETAILED DESCRIPTION

The following detailed description is made with reference to the figures. Example implementations are described to illustrate the technology disclosed, not to limit its scope, which is defined by the claims. Those of ordinary skill in the art will recognize a variety of equivalent variations on the description that follows.

Terminology

As used herein, the term "and/or" should be interpreted to mean one or more items. For example, the phrase "A, B, and/or C" should be interpreted to mean any of: only A, only B, only C, A and B (but not C), B and C (but not A), A and C (but not B), or all of A, B, and C. As used herein, the phrase "at least one of" should be interpreted to mean one or more items. For example, the phrase "at least one of A, B, and C" or the phrase "at least one of A, B, or C" should be interpreted to mean any of: only A, only B, only C, A and B (but not C), B and C (but not A), A and C (but not B), or all of A, B, and C. As used herein, the phrase "one or more of" should be interpreted to mean one or more items. For example, the phrase "one or more of A, B, and C" or the phrase "one or more of A, B, or C" should be interpreted to mean any of: only A, only B, only C, A and B (but not C), B and C (but not A), A and C (but not B), or all of A, B, and C.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The term "coupled" is used in an operational sense and is not limited to a direct or an indirect coupling. "Coupled to" is generally used in the sense of directly coupled, whereas "coupled with" is generally used in the sense of directly or indirectly coupled. "Coupled" in an electronic system may refer to a configuration that allows a flow of information, signals, data, or physical quantities such as electrons between two elements coupled to or coupled with each other. In some cases the flow may be unidirectional, in other cases the flow may be bidirectional or multidirectional. Coupling may be galvanic (in this context meaning that a direct electrical connection exists), capacitive, inductive, electromagnetic, optical, or through any other process allowed by physics.

AI—Artificial Intelligence.

Asserted—a state of a signal or a bit line, equivalent to a Boolean value of "true" or "active".

CMOS—Complementary Metal-Oxide-Semiconductor—a type of field-effect transistor integrated circuit fabrication process.

CPU—central processing unit—an electronic circuit that executes software instructions.

DC—direct current—a current or voltage whose direction does not change.

DC-to-DC converter—an electronic circuit that converts power from one DC voltage to another DC voltage.

Deasserted—a state of a signal or a bit line, equivalent to a Boolean value of "false" or "inactive".

Delay Line—in the context of this document, a delay line is an electronic circuit composed of a series of delay stages through which a signal may travel. The delay stages are nominally equidistant, i.e., the provide equal delays. In practice, even equidistant delay stages may have delay deviations, resulting in output noise. At least part of the delay stages may have an output, and the outputs provide progressively delayed versions of a signal traveling through the delay line.

DLL—delay-locked loop—an electronic circuit with a delay line that synchronizes the delay line speed with the clock cycle of a reference input signal. It outputs one or more delayed versions of the reference input signal on one or more delay line outputs.

DVFS—Dynamic Voltage and Frequency Scaling—adjustment of power and clock frequency of a processor to optimize usage of resources.

EOC—End of Chain—the imminent number of stages through which one clock cycle of a fixed-frequency input clock travels.

FET—Field-Effect Transistor

GPU—graphics processing unit—a processor that is optimized for processing large data streams such as are used in moving graphics.

IC—integrated circuit, also called chip or semiconductor chip.

JFET—Junction Field-Effect Transistor.

LC oscillator—an oscillator employing an inductor (L) and a capacitor (C).

MCM—Multichip Module—an electronic package that includes multiple ICs performing as a single module.

MESFET—metal—semiconductor field-effect transistor.

NAND—Not And—a Boolean function.

NOR—Not Or—a Boolean function.

MOSFET—a metal-oxide-semiconductor field-effect transistor, the predominant type of transistor used in digital and mixed-signal ICs.

PCB—Printed Circuit Board

PVT—semiconductor die conditions that impact the behavior of integrated electronic devices: process, voltage, and temperature.

SoC—system-on-a-chip—an IC that integrates a large amount of functionality.

Implementations

General

Central Processing Units (CPUs), processors for Artificial Intelligence (AI) applications, and other clocked systems may be implemented as large systems on a chip (SoCs), requiring a large amount of power to operate. Based on the overall processing requirement, and software being executed, the instantaneous load on the supply power can vary sharply, which may result in sudden changes in the supply voltage. A droop in the supply voltage may slow down electronic circuits, and result in timing violations and functional failures. In general, a processor has a maximum clock frequency that depends on the available supply voltage. Thus, a clock for a processor operating at or near its maximum clock frequency may need to be slowed down when the processor supply voltage decreases.

FIG. 1 illustrates a conventional system 100 using an input clock. Conventional system 100 includes clock generator 110 which produces input clock 115, used for clocked system 130. Clocked system 130 operates from power supply 140. In some cases, power supply 140 also provides power to clock generator 110. Clocked system 130 may comprise any digital or mixed-signal system that uses a clock signal for clocking synchronous digital logic circuits, and may include an SoC, an MCM, a PCB, or any other module that includes synchronous digital circuits. For example, clocked system 130 may include a chip with one or more processors, such as a CPU, GPU, or AI chip. Clock generator 110 may include as oscillator, such as a crystal oscillator, an LC oscillator, a ring oscillator, or any other oscillator; a frequency generator to take an oscillator output signal and generate a clock signal with another frequency, for example a much higher frequency; a buffer; and any other circuit to produce a input clock normally suitable for clocking clocked system 130. Power supply 140 may include a battery, a DC-to-DC converter, a voltage regulator, a current regulator, and any other circuit commonly used in the art to supply a clocked system with electric power.

Figure 2:
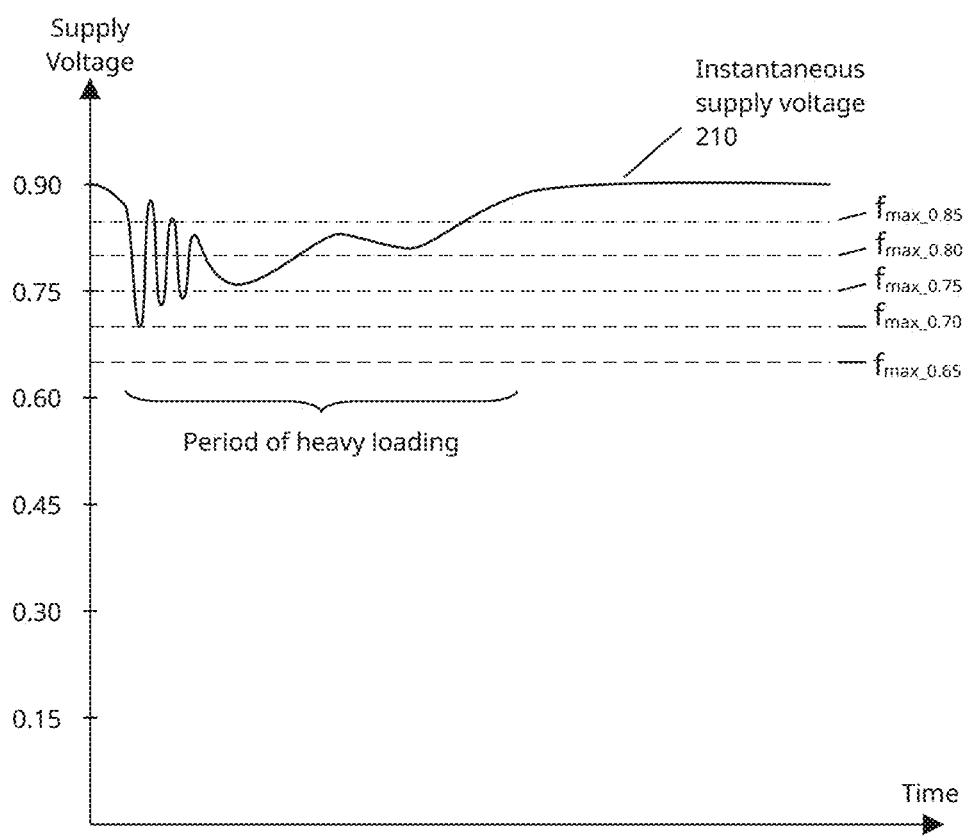
FIG. 2 illustrates that a period of heavy loading causes droops in the supply voltage, which may cause a clocked system to have a lower maximum operational clock frequency.

FIG. 2 illustrates that a period of heavy loading causes droops in the supply voltage, which may cause a clocked system to have a lower maximum operational clock frequency. Chart 200 shows an example of an instantaneous supply voltage 210 as a function of time, including a period of heavy loading. For example, if clocked system 130 includes one or more processors executing software or firmware instructions, then it is possible that during the period of heavy loading the software or firmware executes compute-intensive instructions requiring more current than power supply 140 can immediately deliver, resulting in a drop of the supply voltage. As corrective circuits within power supply 140 set in, the supply voltage may bounce up and down a few times before more slowly correcting back to the required supply voltage. The shape of instantaneous supply voltage 210, as a response to a period of heavy loading, may depend on many factors, including the characteristics of power supply 140, parasitics in the physical implementation of clocked system 130, and the instantaneous requirements posed by software being executed.

Clocked system 130 may require a nominal supply voltage of, for example, 0.9V. It may have been characterized or simulated to operate at a maximum clock frequency $f_{max\_0.85}$ when the supply voltage equals 0.85V. So when the supply voltage is nominally 0.9V it has a safety margin of 0.05V for operation at $f_{max\_0.85}$. At 0.8V, 0.75V, 0.7V and 0.65V it may have been characterized or simulated to operate at maximum clock frequencies $f_{max\_0.80}$, $f_{max\_0.75}$, $f_{max\_0.70}$, and $f_{max\_0.65}$, respectively. These respective frequencies are progressively lower for normal MOSFET semiconductor processes. I.e., if the supply voltage is lower, the maximum clock frequency is lower. If a synchronous digital circuit is operated at a frequency above its maximum clock frequency, timing violations and functional errors occur. Therefore, in the situation depicted in FIG. 2, during the period of heavy loading, instantaneous supply voltage 210 drops to as low as 0.7V, at which the clocked system 130 could only be safely operated at a clock frequency up to $f_{max\_0.65}$. Thus, to prevent failure due to the limitations of power supply 140, clocked system 130 needs to be operated at a clock speed significantly below its performance available at the full supply voltage of 0.9V.

Figure 3:
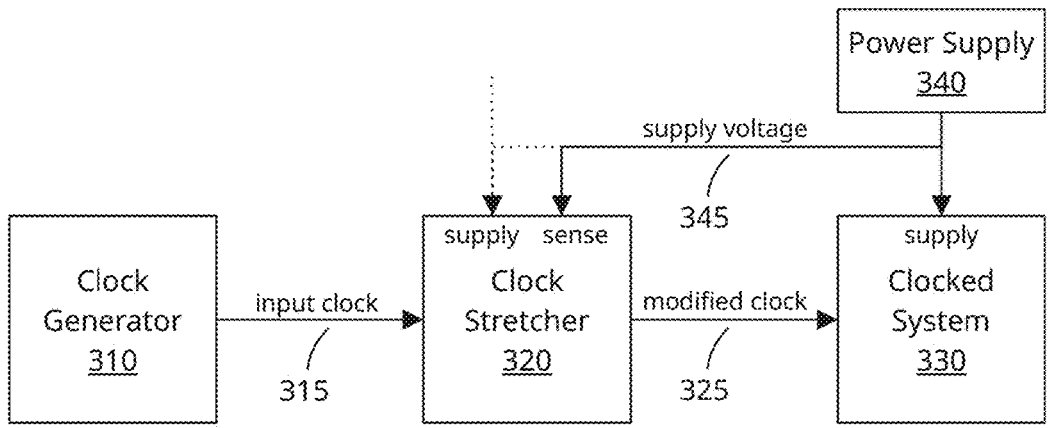
FIG. 3 illustrates an example system employing a clock stretcher according to an implementation of the disclosed technology.

FIG. 3 illustrates an example system 300 employing a clock stretcher according to an implementation of the disclosed technology. System 300 includes clock generator 310, clock stretcher 320, clocked system 330, and power supply 340. Clock generator 310 generates input clock 315 which it forwards to clock stretcher 320. Clock stretcher 320 senses supply voltage 345 and temporarily lowers the frequency of the clock during a period of heavy loading, resulting in modified clock 325 which it forwards to clocked system 330. Power supply 340, which delivers supply voltage 345, powers clocked system 330 and in some implementations also clock stretcher 320. However, in other implementations, clock stretcher 320 may receive its supply power from another source or it may include an intervening voltage regulator. The function of clock stretcher 320 is to sense how much supply voltage 345 drops below its nominal value, and lower the frequency of modified clock 325 accordingly to a value at which clocked system 330 can remain operating safely without experiencing timing violations and functional failures.

Clocked system 330 may be or include any digital or mixed-signal system that uses a clock signal for clocking synchronous digital logic circuits, and may include an IC, an SoC, an MCM, a PCB, or any other module that includes synchronous digital circuits. For example, clocked system 330 may include a chip with one or more processors, such as a CPU, GPU, or AI chip. Clock generator 310 may include as oscillator, such as a crystal oscillator, an LC oscillator, a ring oscillator, or any other oscillator; a frequency generator to take an oscillator output signal and generate a signal with another frequency, for example a much higher frequency; a buffer; and any other circuit to produce a input clock suitable for clocking clocked system 330. Power supply 340 may include a battery, a DC-to-DC converter, a voltage regulator, a current regulator, and any other circuit commonly used in the art to supply a clocked system with electric power. In some implementations, a single semiconductor chip, MCM, or PCB may include one or more of clock generator 310, clock stretcher 320, clocked system 330, and/or power supply 340.

Figure 4:
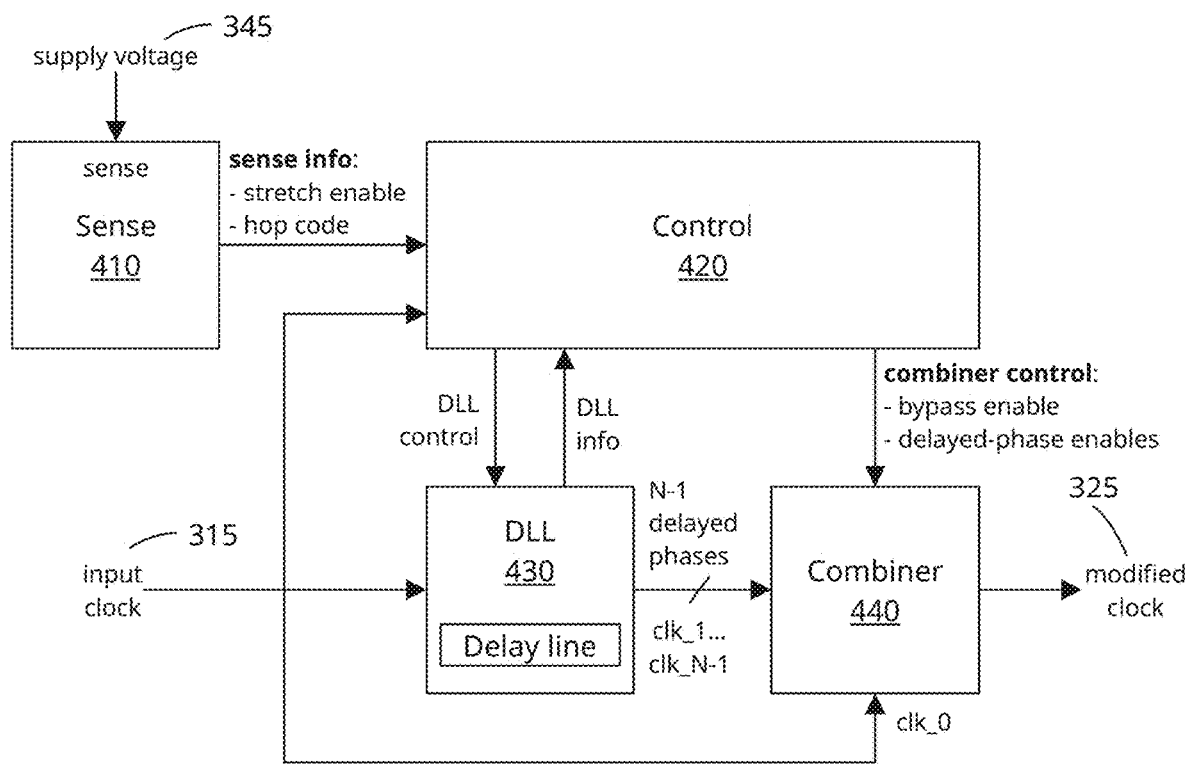
FIG. 4 illustrates example details of the clock stretcher according to an implementation of the disclosed technology.

FIG. 4 illustrates example details of clock stretcher 320 according to an implementation of the disclosed technology. Clock stretcher 320 includes sense circuit 410, control circuit 420, DLL 430, and combiner circuit 440. Sense circuit 410 is operable to receive supply voltage 345 at its sense input. It has one or more outputs that are coupled with control circuit 420 to provide sense information. In general, sense circuit 410 senses or measures the condition of one or more parameters to determine the sense information. The sense information may include information about the measured voltage (the supply voltage 345) of power supply 340. For example it may include a digitized amplitude of supply voltage 345, or it may include a signal indicating that supply voltage 345 has dropped below one or more preset thresholds, such as the thresholds related to $f_{max\_0.85}$, $f_{max\_0.80}$, $f_{max\_0.75}$, $f_{max\_0.70}$, and $f_{max\_0.65}$ of FIG. 2. In an implementation, the sense information may include one or more enable signals, a stretch enable signal that allows switching between a passive and a stretching mode, a required length N1 (i.e., a number of delay stages) that the implementation should use to synchronize to input clock 315, and a hop code that, with the DLL length, determines the fraction that the clock is stretched. The hop code and the stretch enable are examples of signals that may change as the supply voltage 345 and/or other conditions such as the temperature change. Control circuit 420 uses the sense information, as well as DLL information received from DLL 430, to control both DLL 430 and combiner circuit 440. The DLL information may include the DLL phase error, the EOC, and the timing and size of a DLL speed correction. In some implementations, the DLL information may include parameters derived from those, passing only values that would give rise to pulse shortening, i.e. values relating to a glitch if uncompensated. Based on a sensed value of supply voltage 345, sense circuit 410 or control circuit 420 generates the hop code h, whose value control circuit 420 uses for phase selection in combiner circuit 440. DLL 430 receives input clock 315 at its input. It has a delay line with N delay stages, and at least N−1 outputs at which it provides N−1 progressively delayed versions (or equidistant "phases") of input clock 315. For example, a first delay stage output may provide an output signal clk_1 that equals input clock 315 delayed by a time Δt, a second delay stage output may provide an output signal clk_2 that equals input clock 315 delayed by 2Δt, and so on. The Nth delay stage produces a signal clk_N that equals input clock 315 delayed by NΔt. The delay line forwards clk_1 through clk_N−1 to combiner circuit 440. The implementation may use signal clk_N internally within DLL 430. Control circuit 420 further generates the combiner control signals, which it passes to combiner circuit 440, and which may include a bypass enable signal and one or more addresses of delay stage outputs to be coupled with the clock stretcher output that provides modified clock 325. The one or more addresses may include, for example, a binary number, or a 1-hot code.

To perform the functionalities described in this document, control circuit 420 may include memories or registers to store the following parameters used for correcting various types of glitches: the offset skip value os, the minimum hop value mh, the code change hop value cch, the zero code stretch value zcs, the phase rollback wait value waw, and the bypass skip value bs.

DLL 430 may be configured (for example, by DLL control signals from control circuit 420) to ensure that N times Δt equals one average clock cycle time of input clock 315. While the DLL is in lock, the phase of clk_N is shifted by 2π radians from the phase of input clock 315. DLL 430 provides at least N−1 phases clk_1 . . . clk_N−1 to combiner circuit 440 which also receives input clock 315. The delay stage output signal clk_N may not be coupled to the combiner, as the implementation may use the undelayed signal of input clock 315 in its place.

In implementations, control circuit 420 may also configure DLL 430 to lock the input clock 315 clock cycle time T to less than the delay of N delay stages, i.e. to less than N times Δt.

Combiner circuit 440 receives the at least N−1 phases from DLL 430 as well as input clock 315. Controlled by combiner control signals from control circuit 420, combiner circuit 440 passes input clock 315 at times when the clock does not need to be slowed down, and it cycles through the phases clk_0 (which equals input clock 315) and clk_1 . . . clk_N−1 when the clock needs to be slowed down, as further detailed in FIGS. 11-13. Some of the time, combiner circuit 440 may create modified clock 325 from combining phases clk_0 . . . clk_N−1 as discussed below, and at other times it may pass clk_0 to the output as modified clock 325.

Some implementations may power DLL 430 from a power supply that is separately regulated from supply voltage 345. Other implementations power DLL 430 from supply voltage 345 without intervening voltage regulation.

Figure 5:
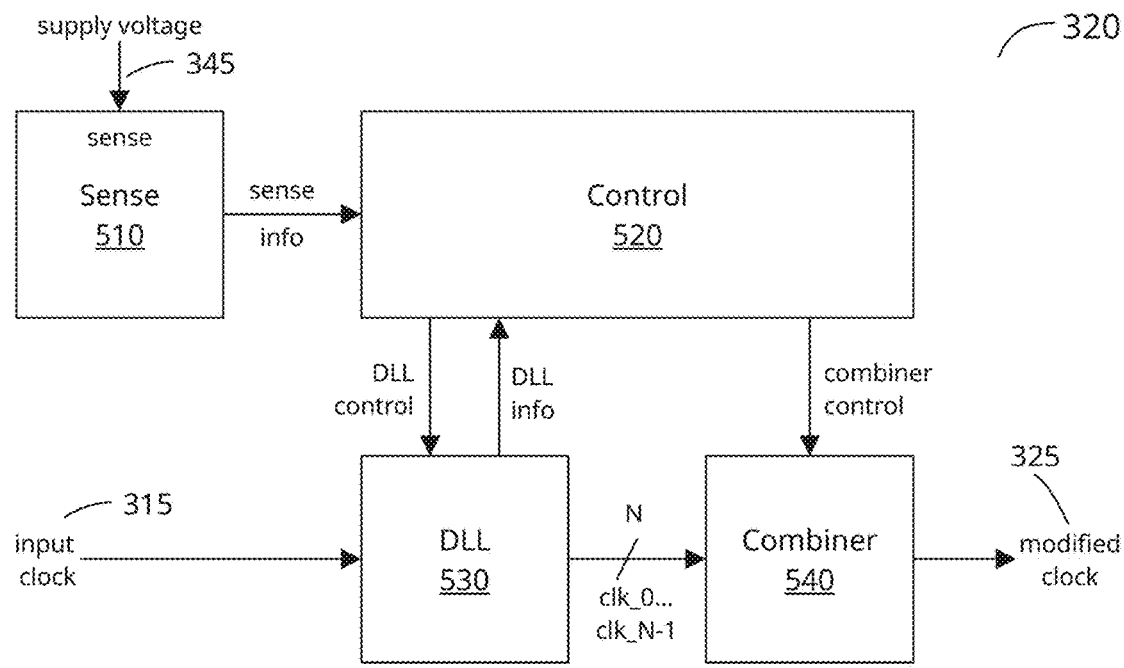
FIG. 5 illustrates details on another example clock stretcher implementation.

FIG. 5 illustrates details on another example clock stretcher 320 implementation. This implementation includes sense unit 510, control circuit 520, DLL 530, and combiner circuit 540. Its functionality is largely the same as in FIG. 4, however, there is no direct connection between the input clock 315 input and combiner circuit 540. Sense unit 510 has the same functionality as sense circuit 410, control circuit 520 has the same functionality as control circuit 420, and DLL 530 has the same functionality as DLL 430. However, DLL 530 forwards at least N phases (instead of at least N−1 phases) to combiner circuit 540. The number of delay stages in DLL 530 is at least N+1, and DLL 530 synchronizes the delay between a first and a last of the at least N+1 delay stages to the input clock 315 clock cycle time T. DLL 530 may include one or more initial delay stages before the first of the N+1 stages, providing a delay offset for all forwarded phases. Those initial delay stages may help to reduce jitter. Combiner circuit 540 uses the first of the forwarded N phases (clk_0) as the "undelayed" signal, i.e., similar to how the implementation in FIG. 4 uses input clock 315.

Some implementations may power DLL 530 from a power supply that is separately regulated from supply voltage 345. Other implementations power DLL 530 from supply voltage 345 without intervening voltage regulation. Further implementations provide a bypass for input clock 315 to modified clock 325, so that when no clock stretching is needed, they can bypass DLL 530 and combiner circuit 540 to save power and reduce jitter.

Figure 6:
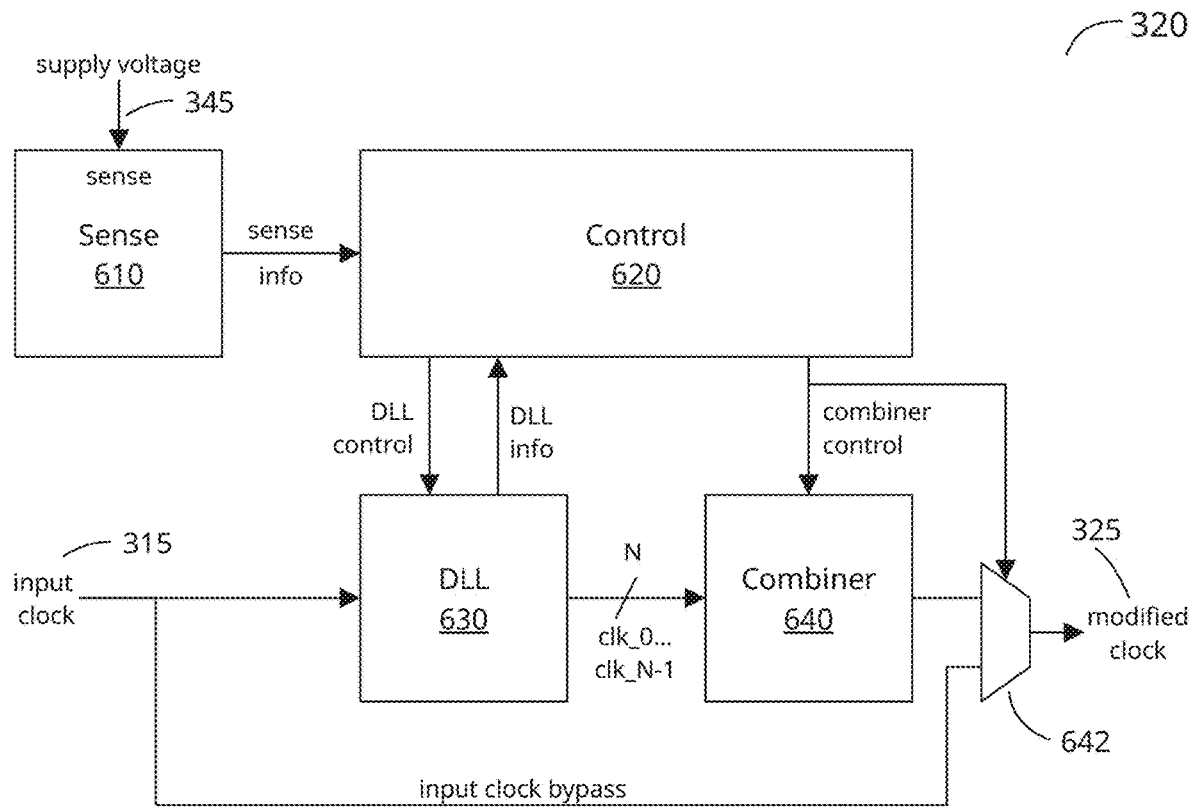
FIG. 6 illustrates details of an example clock stretcher with a full input clock bypass according to an implementation of the disclosed technology.

FIG. 6 illustrates details of an example clock stretcher 320 with full input clock bypass according to an implementation of the disclosed technology. This implementation includes sense unit 610, control circuit 620, DLL 630, combiner circuit 640, and bypass multiplexer 642. Again, the functionality of sense unit 610, control circuit 620, and DLL 630 is the same as the functionality of sense circuit 410, control circuit 420, and DLL 430. This implementation combines advantages of the implementations in FIG. 4 and FIG. 5, and it allows fully bypassing DLL 630 and combiner circuit 640 when in passive mode, i.e., when no stretching occurs. The bypass allows placing DLL 630 and combiner circuit 640 in a power saving mode when they are not operational, and it also reduces jitter in modified clock 325. DLL 630 passes N phases clk_0 . . . clk_N−1 to combiner circuit 640, which allows for some offset between input clock 315 and clk_0 from some initial delay line stages that may be used to reduce delay line jitter. FIG. 6 shows bypass multiplexer 642 as separate from combiner circuit 640, however, some implementations may incorporate bypass multiplexer 642 within combiner circuit 640. Also, some implementations implement bypass multiplexer 642 with combinatorial logic only, and other implementations implement bypass multiplexer 642 with pass gates.

Figure 7:
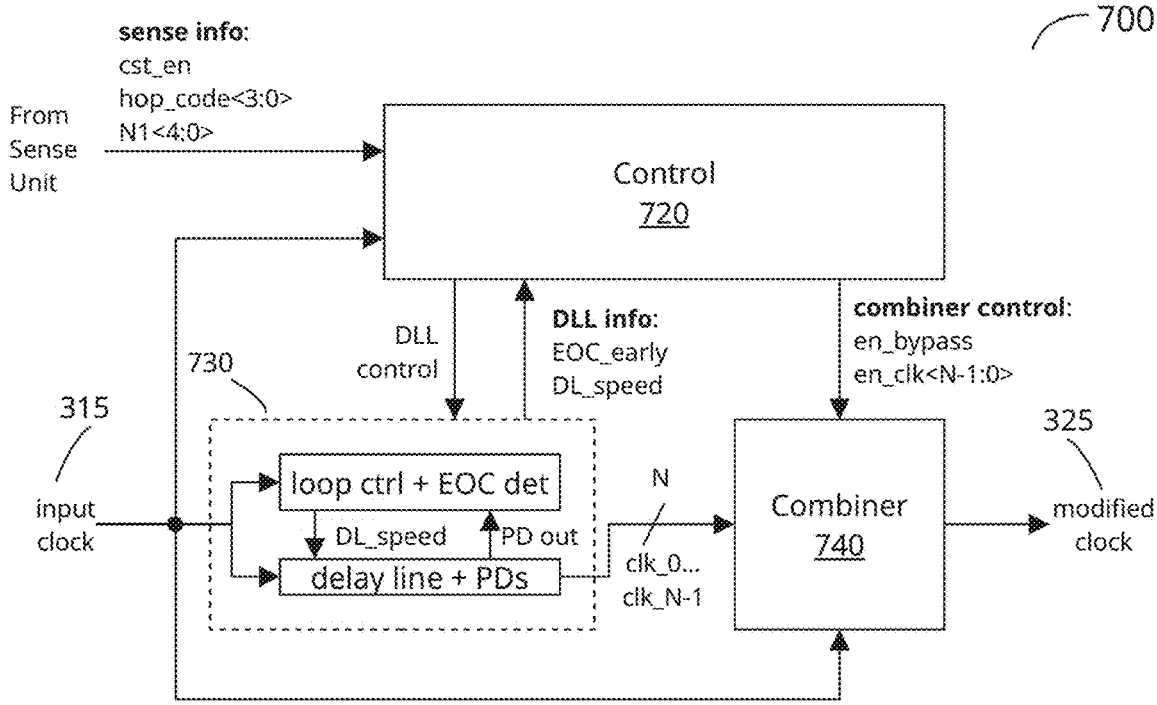
FIG. 7 illustrates details of a clock stretcher in an implementation of the disclosed technology.

MOM FIG. 7 illustrates details of a clock stretcher 700 in an implementation of the disclosed technology. Clock stretcher 700 includes control unit 720, DLL 730, and combiner 740. The sense unit has not been drawn. The sense unit provides control unit 720 with sense information, including cst_en, a 4-bit hop code hop_code<3:0>, and a 5-bit required length N1<4:0>. Control unit 720 receives DLL information from DLL 730, including the signals EOC_Early (explained with reference to FIG. 13) and the delay line speed control signal (explained with reference to FIG. 9 and FIG. 10) DL_speed. Based on the sense information and the DLL information, control unit 720 generates combiner control information, including the signals en_bypass, which enables bypassing DLL 730 in passive mode, and en_clk<N−1:0>, which provides a 1-hot encoded phase selection address for combiner 740. DLL 730 includes a delay line with a series of phase detectors. The delay line's speed is controlled by the DL_speed signal. The phase detector outputs are coupled with an end-of-chain (EOC) detector, which may be integrated with the DLL loop control circuitry. The DLL loop control circuitry uses the EOC information to calculate a phase error, the EOC_early signal, and the DL_speed signal as will be detailed in later figures. Combiner 740 takes input clock 315 and clk_0 . . . clk_N−1 as clock inputs for combining. When en_bypass is active, clock stretcher 700 passes input clock 315 as modified clock 325. In other cases, when en_clk<m> is active, combiner 740 passes clk_m as modified clock 325.

Figure 8:
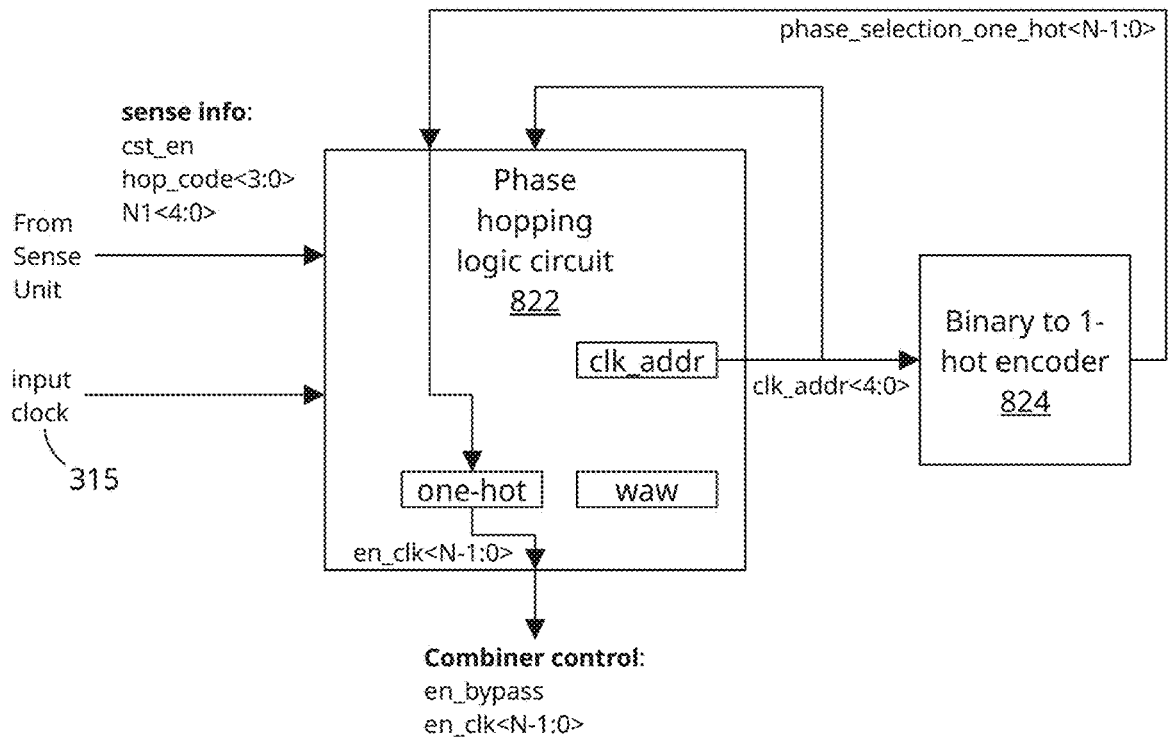
FIG. 8 illustrates details of a control unit in an implementation of the disclosed technology.

FIG. 8 illustrates details of a control unit 820 in an implementation of the disclosed technology. Control unit 820 includes phase hopping logic circuit 822 and binary to 1-hot encoder 824. Phase hopping logic circuit 822 receives the sense information, including the signals cst_en, hop_code<3:0> and N1<4:0>, and generates the combiner control information, including the signals en_bypass and en_clk<N−1:0>. It also generates the combiner address clk_addr<4:0>. Binary to 1-hot encoder 824 takes the combiner address and decodes it into phase_selection_one_hot<N−1:0>, which is returned to phase hopping logic circuit 822 and used to generate en_clk<N−1:0>. Phase hopping logic circuit 822 may include combinational logic as well as registers. Registers include clk_addr, one hot, and waw. Among the signals internal to phase hopping logic circuit 822 is waw_1, whose function is described with reference to FIG. 27.

Figure 9:
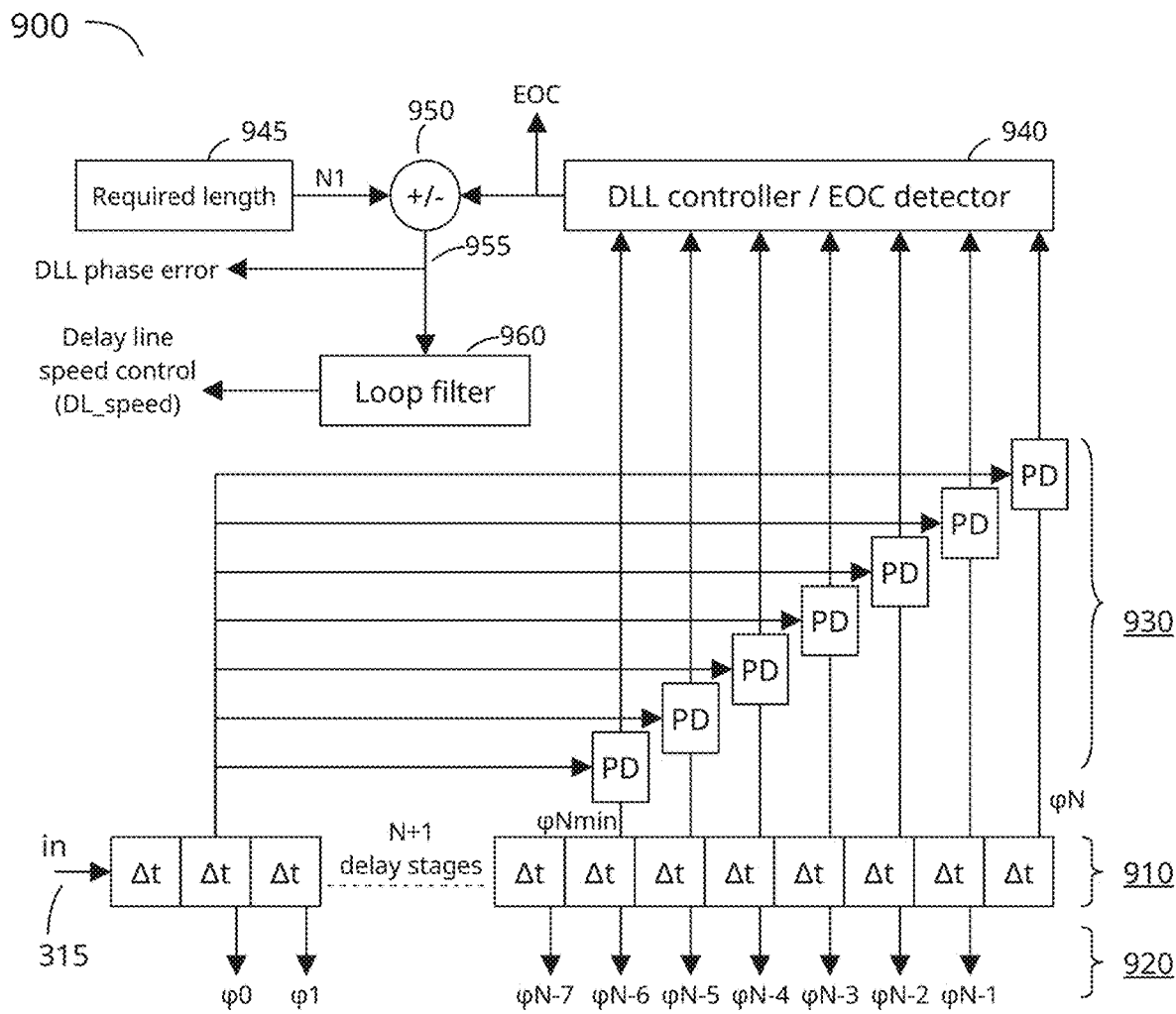
FIG. 9 illustrates a first example DLL for a clock stretcher according to an implementation of the disclosed technology.

FIG. 9 illustrates a first example DLL 900 for a clock stretcher according to an implementation of the disclosed technology. DLL 900 includes at least N+1 delay stages of delay line 910, with phase outputs 920 (φ0 . . . φN, also denoted here as clk_0 . . . clk_N), up to N phase detectors 930, and DLL controller 940. It further includes required length interface 945 (which may include a memory or a register), phase comparator 950, and loop filter 960. An input signal (input clock 315) travels through the delay stages of delay line 910 and is first visible as clk_0 (or φ0) at the initial delay line output and last visible as clk_N (or φN) at the final delay line output. (The initial delay line output does not need to be at the very first delay stage, and the final delay line output does not need to be at the very last delay stage.) At least a part of the delay line output signals are forwarded to phase detectors 930. Seven phase detectors 930 are drawn, coupled to successive delay stages, but an implementation may have any number of phase detectors 930 from 1 to N. Phase detectors 930 may be coupled to successive delay stages going backwards from the final delay stage towards the initial delay stage, or an implementation may skip some delay stages.

DLL controller 940 selects an output signal of one of the phase detectors 930 and measures or calculates the EOC in an EOC detector. The EOC stands for the detected number of stages through which one clock cycle T of input clock 315 travels. Phase comparator 950 compares the EOC with the required length N1 from required length interface 945 and forwards their difference, DLL phase error 955, to loop filter 960, which may include an integrator and other filter functions. Loop filter 960 outputs the delay line speed control value, which the implementation uses to control the delay line speed, thus forming a negative feedback loop. The delay line speed may be defined as the number of delay stages through which one pulse of input clock 315 travels, divided by the clock period T of the input clock 315 pulse. The negative feedback loop locks the delay of N1 delay stages to the clock cycle T of input clock 315. Thus, when in lock, the nominal delay line speed equals N1 delay stages divided by a clock period T of the input clock signal. The instantaneous delay line speed may deviate, and equal EOC delay stages divided by a clock period T of the input clock signal. DLL 900 may control the speed of delay line 910 based on the delay line speed control value in any way known in the art, including by using a digitally tunable capacitor bank or by using current pinching. DLL controller 940 may determine EOC for every cycle of input clock 315 to allow for an immediate response to changes in the power supplied to DLL 900. Although required length interface 945, phase comparator 950, and loop filter 960 may operate at the frequency of input clock 315, in some implementations they operate at a lower frequency, for example at between half and a sixteenth of the frequency of input clock 315.

As described with reference to FIG. 4, DLL 900 generates the DLL information for control circuit 420, control circuit 520, or control circuit 620. DLL 900 may directly include the EOC, the DLL phase error, and/or the delay line speed control into the DLL information, and leave the respective control unit with extracting information relevant to clock stretcher glitches, or DLL 900 may do so for the control unit. For example, if delay line 910 is slow due to a drop in the DLL supply voltage, the EOC will be lower than the required length N1 and the DLL phase error will be positive. A positive phase error will give a glitch, so some implementations may derive an EOC_Early parameter that equals the DLL phase error for positive values, and that is zero otherwise. Some implementations may include EOC_Early in the DLL information, whereas other implementations may include the DLL phase error, or the EOC. Similarly, some implementations may include the delay line speed control value, whereas other implementations may include a derived Boolean parameter that indicates whether the delay line speed control value equals zero or not.

Figure 10:
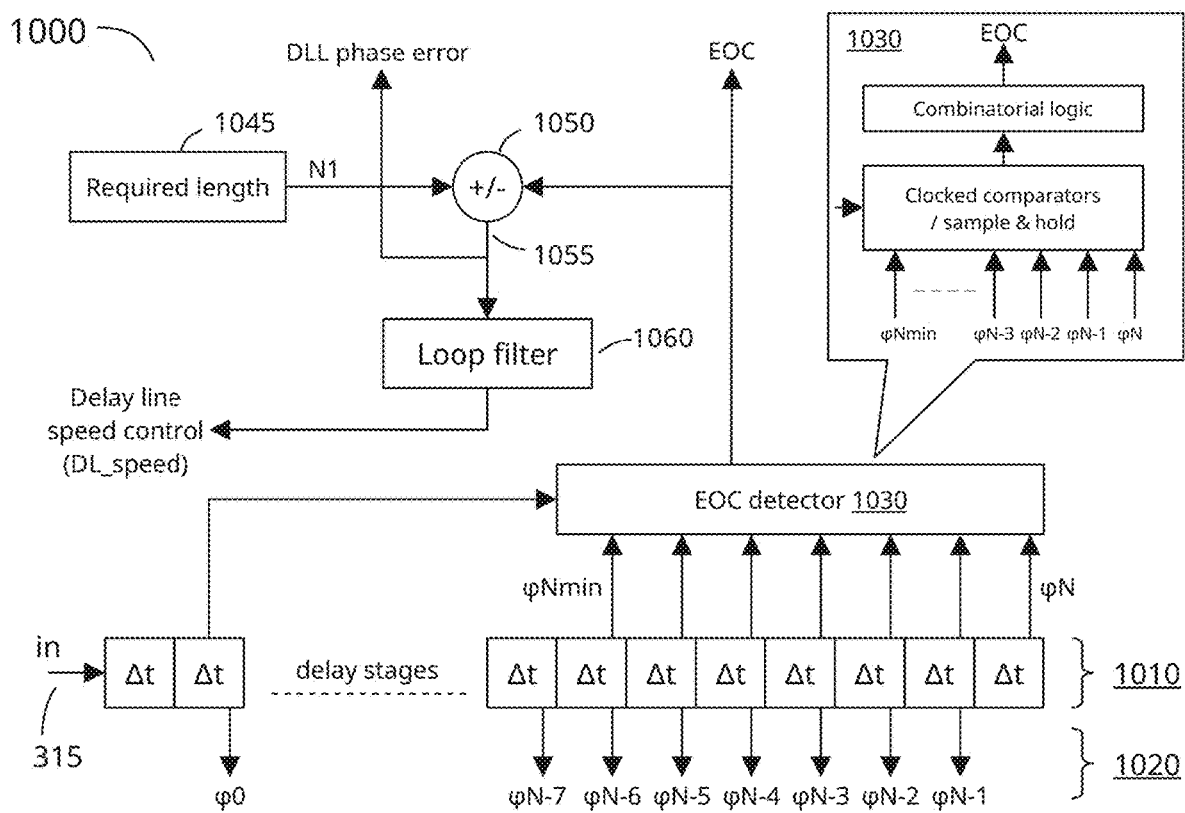
FIG. 10 illustrates a second example DLL for a clock stretcher according to an implementation of the disclosed technology.

FIG. 10 illustrates a second example DLL 1000 for a clock stretcher according to an implementation of the disclosed technology. It synchronizes the input clock 315 clock pulse cycle time T to a required actively used length of its delay line delay. DLL 1000 comprises a delay line including at least N+1 delay stages 1010, phase outputs 1020, EOC detector 1030, required length interface 1045, phase subtractor 1050 and loop filter 1060. DLL 1000 receives input clock 315 at the start of the delay line, and makes the input clock pulses travel through delay stages 1010. A series of N successive delay stages are coupled to phase outputs 1020 to provide equidistant phase signals (φ0 . . . φN−1, i.e., clk_0 . . . clk_N−1) for combiner circuit 440, combiner circuit 540 or combiner circuit 640. The series of N successive delay stages may be preceded by zero or more (e.g., up to ten) additional delay stages, providing an offset delay to all phase outputs 1020, and potentially lowering phase jitter. The series of N successive delay stages is followed by at least one delay stage that internally delivers φN (clk_N), and may be followed by additional dummy stages to further reduce jitter. EOC detector 1030 receives phase signals φNmin . . . φN (where Nmin determines the shortest effective length that the delay line may have and N determines the longest effective length that the delay line may have), and EOC detector 1030 is clocked by phase φ0. Upon receiving a positive edge from φ0, EOC detector 1030 detects a positive edge from among the phases φNmin . . . φN (in some implementations, upon receiving a negative edge from φ0, it detects a negative edge), and forwards the resulting phase number to phase subtractor 1050, which subtracts it from the number N1 at required length interface 1045. When a input clock 315 clock pulse with clock cycle time T travels through the delay line, upon receiving the start of a clock pulse at phase φ0, EOC detector 1030 detects the start of the previous clock pulse between φNmin and φN, and determines its phase number. The phase number represents the number of delay stages through which the previous clock pulse has traveled, i.e., the number of delay stages that delays the input clock 315 by one clock period T. When the DLL is in lock, this number (on the average) equals the required length N1 at required length interface 1045, and the average difference (DLL phase error 1055) equals zero. However, the instantaneous DLL phase error 1055 may be unequal to zero when a supply voltage drop occurs. The difference is passed on to loop filter 1060, whose output is used to adjust the delay line speed, for example by reducing or increasing supply current available to the delay stages. A change in delay line speed will result in a different number of delay stages through which the input clock 315 clock pulses travel, and because of the negative feedback this number will lock to the required length. An implementation may implement EOC detector 1030 in many ways. It may comprise clocked comparators coupled with combinatorial logic (as shown), sample and hold circuits coupled with combinatorial logic, comparators, sample gates, a thermometer-to-binary converter, a thermometer-to-gray converter, or any other circuits known in the art to detect where in a chain of delay stages a signal transition occurs.

The DLL in FIG. 9 has been drawn with an offset of one Δt between input clock 315 and φ0 (clk_0). The DLL in FIG. 10 has been drawn with an offset of 2Δt. The DLLs receive their input clock pulses from input clock 315. In general, an implementation may have an offset of a few delay stages, for example up to ten delay stages, or 10Δt. In those cases, the first of the N equidistant phases generated by the delay line, i.e. φ0 or clk_0, is or equals a delayed version of input clock pulses traveling through the delay line. An implementation may also have no offset, i.e., the first of the N equidistant phases is not generated by the delay line, but it equals the input signal—an undelayed version of input clock pulses traveling through the delay line. As later described with reference to FIG. 17, the DLL phase comparator and loop filter may operate at a slower speed than input clock 315. For example, in case of a digital PLL, the phase comparator and loop filter may operate at a DLL internal clock frequency that is lower than the frequency of input clock 315, even though phase detectors 930 or EOC detector 1030 may be clocked at the same frequency as input clock 315 and provide the EOC signal for each pulse in input clock 315.

Figure 11:
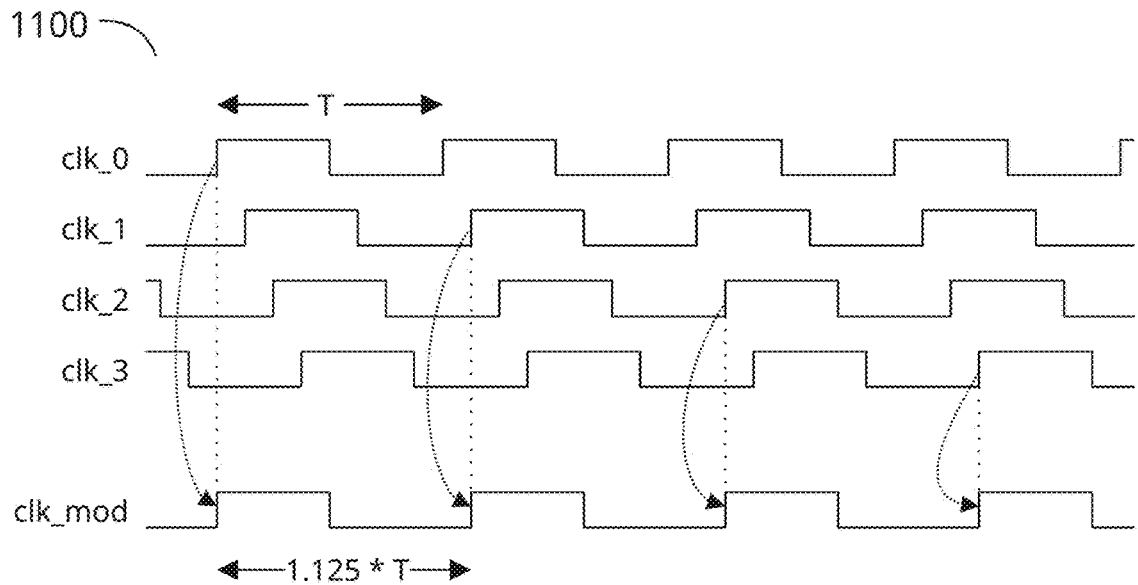
FIG. 11 illustrates a first example of slowing down a clock according to an implementation of the disclosed technology.

FIG. 11 illustrates a first example 1100 of slowing down a clock according to an implementation of the disclosed technology. First example 1100 shows four consecutive phases clk_0 through clk_3, with phase delays of 2π/8 radians, or one eighth clock cycle T/8. Combiner circuit 440 may create modified clock clk_mod from clk_0 . . . clk_3 by first passing clk_0, then in the next clock cycle passing clk_1, in the following clock cycle passing clk_2, etc. After passing clk_7 (not drawn), combiner circuit 440 or combiner circuit 540 starts over and passes clk_0. By cyclically passing consecutive phases of an input clock that are shifted T/8 in time, combiner circuit 440 or combiner circuit 540 creates a modified clock clk_mod whose cycle has a duration of 1.125*T, i.e. its frequency is one eighth lower than the frequency of each of the input phases clk_0 . . . clk7.

In a similar fashion, combiner circuit 440 or combiner circuit 540 may modify the clock frequency by two eighths by each time skipping one phase. This means that it consecutively passes clk_0, clk_2, clk_4, clk_6, clk_0, etc. It may slow down the clock by three eighths by each time skipping two phases. That means that it consecutively passes clk_0, clk_3, clk_6, clk_2, clk_5, clk_0, etc. Thus, for a delay line of length N, combiner circuit 440 or combiner circuit 540 can output clocks with N different frequencies. The highest frequency is when no hopping occurs, i.e. it continuously passes clk_0 or any of the other phases to its output. In this case, the output clock has the same frequency as the input clock. The lowest frequency is when maximum hopping occurs, i.e. N−1 hops (or N−2 skips). In that case, the output frequency equals N/(2N−1) times the input frequency.

It should be noted that the method in FIG. 11 yields a modified frequency whose duty cycle is unequal to 50%. The method does not stretch the pulses, but the time in between pulses. For some clocked systems this may be acceptable, but other clocked systems may require a duty cycle close to 50%. For those cases, an implementation may use the method shown in FIG. 12.

Figure 12:
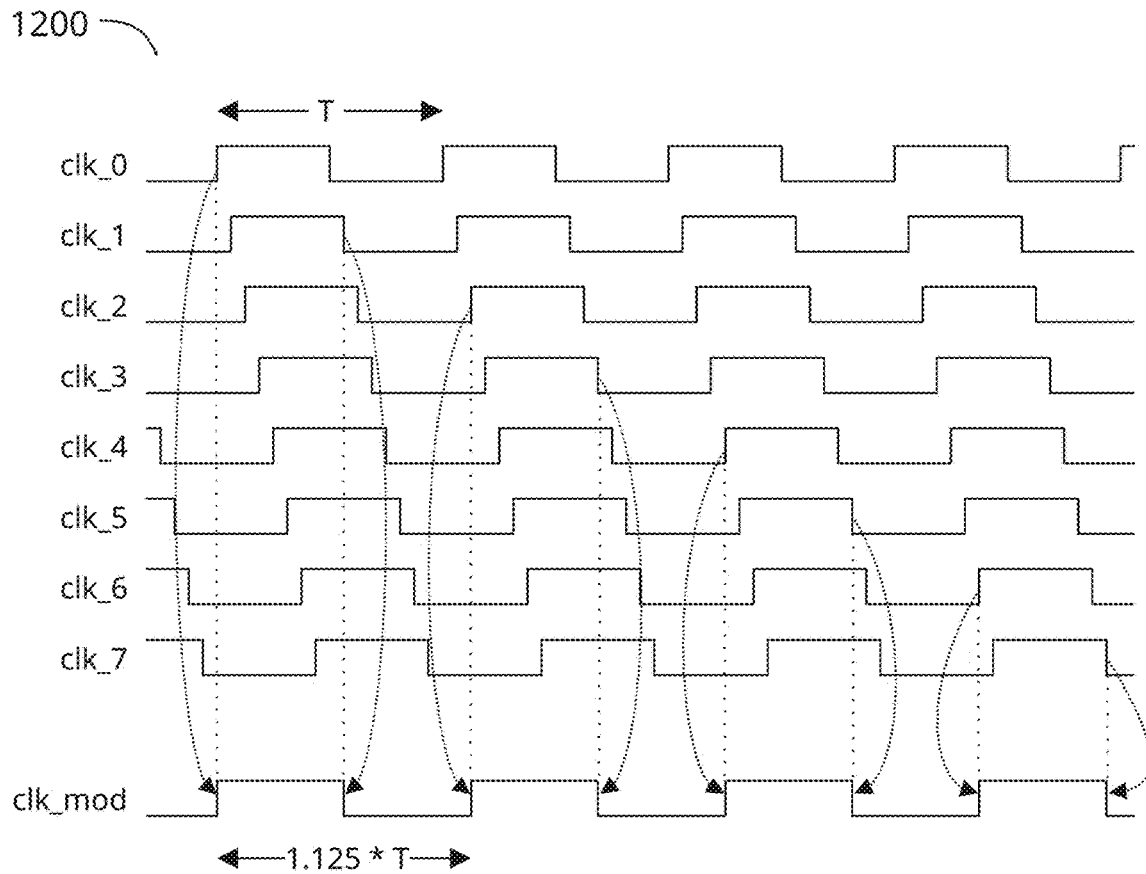
FIG. 12 illustrates a second example of slowing down a clock according to an implementation of the disclosed technology.

FIG. 12 illustrates a second example 1200 of slowing down a clock according to an implementation of the disclosed technology. Second example 1200 shows 8 out of 16 consecutive phases that are each one-sixteenth clock cycle apart (N=16). In this implementation, combiner circuit 440 or combiner circuit 540 combines two phases for each pulse of the modified clock clk_mod. For example, as illustrated, combiner circuit 440 or combiner circuit 540 creates a modified clock whose frequency is one-eighth lower than the input frequency, and whose duty cycle (theoretically) equals 50%. To create the first pulse of clk_mod, combiner circuit 440 or combiner circuit 540 passes clk_0 plus clk_1 to clk_mod, i.e. clk_mod=clk_0 OR clk_1. To create the second pulse of clk_mod, combiner circuit 440 or combiner circuit 540 passes clk_2 plus clk_3, i.e. clk_mod=clk_2 OR clk_3, etc.

As can be readily understood, an implementation may use the method in FIG. 12 to create lower modified frequencies by skipping (hopping) in a similar fashion as discussed with reference to FIG. 11. Since there are N possible different hop codes, and the method uses two overlapping phases to create one pulse of the modified clock, it can (theoretically) create N/2 different frequencies with 50% duty cycle (including the full-frequency signal). Additionally, it allows creation of another N/2 frequencies with near-equal duty cycle.

Clock Stretcher with Increased Input Frequency Range

It was shown above that combiner circuit 440, combiner circuit 540, and combiner circuit 640 have an output frequency range of roughly one octave. The highest output frequency equals the input frequency (of input clock 315), and theoretically the lowest output frequency equals N/(2N−1) times the input frequency, which for a large value of N approaches half the input frequency.

The input frequency range of a conventional clock stretcher is much narrower than the output frequency range. This is because the DLL's delay line is typically created from a chain of logic gates, for example a chain of inverters or NAND gates. Although the gate delay can be controlled using a digitally-controlled capacitor or a digitally-controlled resistor, the control range is limited, and therefore a DLL with a fixed number of N stages can handle a small range of clock frequencies. Based on a gate delay that can be varied between $\Delta$tmin and $\Delta$tmax, the N stages give a total delay between Tmin=N*$\Delta$tmin and Tmax=N*$\Delta$tmax.

Implementations increase the range of possible input frequencies by making the number of input stages variable. This can be achieved with each of the DLLs in FIGS. 9-10. Whereas a conventional DLL compares the first or input phase with the last phase, a DLL in an implementation calculates EOC and compares it with the required length N1 to obtain the DLL phase error. By choosing an N1 value that is appropriate for the input clock 315 frequency, the DLL can lock the delay line to a much larger range of input frequencies than is possible with conventional clock stretchers. By determining EOC at each occurrence of a input clock 315 clock cycle, an implementation allows for changing the input clock 315 frequency in runtime.

Clock Stretcher with Correction for Glitches Due to Finite DLL Bandwidth

A DLL synchronizes its delay speed to the input clock 315 clock cycle time T using a negative feedback loop. The loop includes a loop filter with limited bandwidth to ensure stability. The limited bandwidth results in corrections not being instantaneous. If the clock stretcher receives its own power supply from power supply 340 and the supply voltage 345 suddenly droops, the delay line may become slower, and it may take the negative feedback loop some time to correct this slowdown. The DLL receives a required length N1 in runtime, and locks the delay of N1 delay stages to the input clock 315 clock cycle time T. For any one input clock 315 clock pulse traveling through the delay line the DLL measures or determines the instantaneous EOC, i.e., the number of delay stages through which one clock cycle T of input clock 315 travels.

A delay line with Nmax stages, that synchronizes the input clock 315 clock cycle time T to N1 stages (where N1<Nmax), may slow down during a droop and the input clock 315 clock cycle T may travel through only EOC stages instead of N1 stages (EOC<N1). When phase selection wraparound occurs, the modified clock goes from a pulse that is (too much) delayed to a pulse that is undelayed or correctly delayed. Thus, the time between the pulse before wraparound and the pulse after wraparound is too short, which jeopardizes the functionality of clocked system 330.

A first implementation detects the slowdown (the phase error, i.e., N1−EOC), and adds it to the hop size when a phase selection wraparound occurs. In an example, the DLL has a hop code (i.e., phase selection step size for successive modified clock pulses) of 1 and synchronizes T to a required length of N1=28 stages. If during a droop the delay line slows down so that the clock cycle T covers EOC=25 stages, then there is a phase error of 3 stages. Instead of selecting clk_0 after clk_N1−1, the implementation selects clk_3 after clk_N1−1.

A second implementation detects the slowdown and determines EOC. Instead of wrapping its phase selection around at N1 stages, it wraps around at EOC stages.

Figure 13:
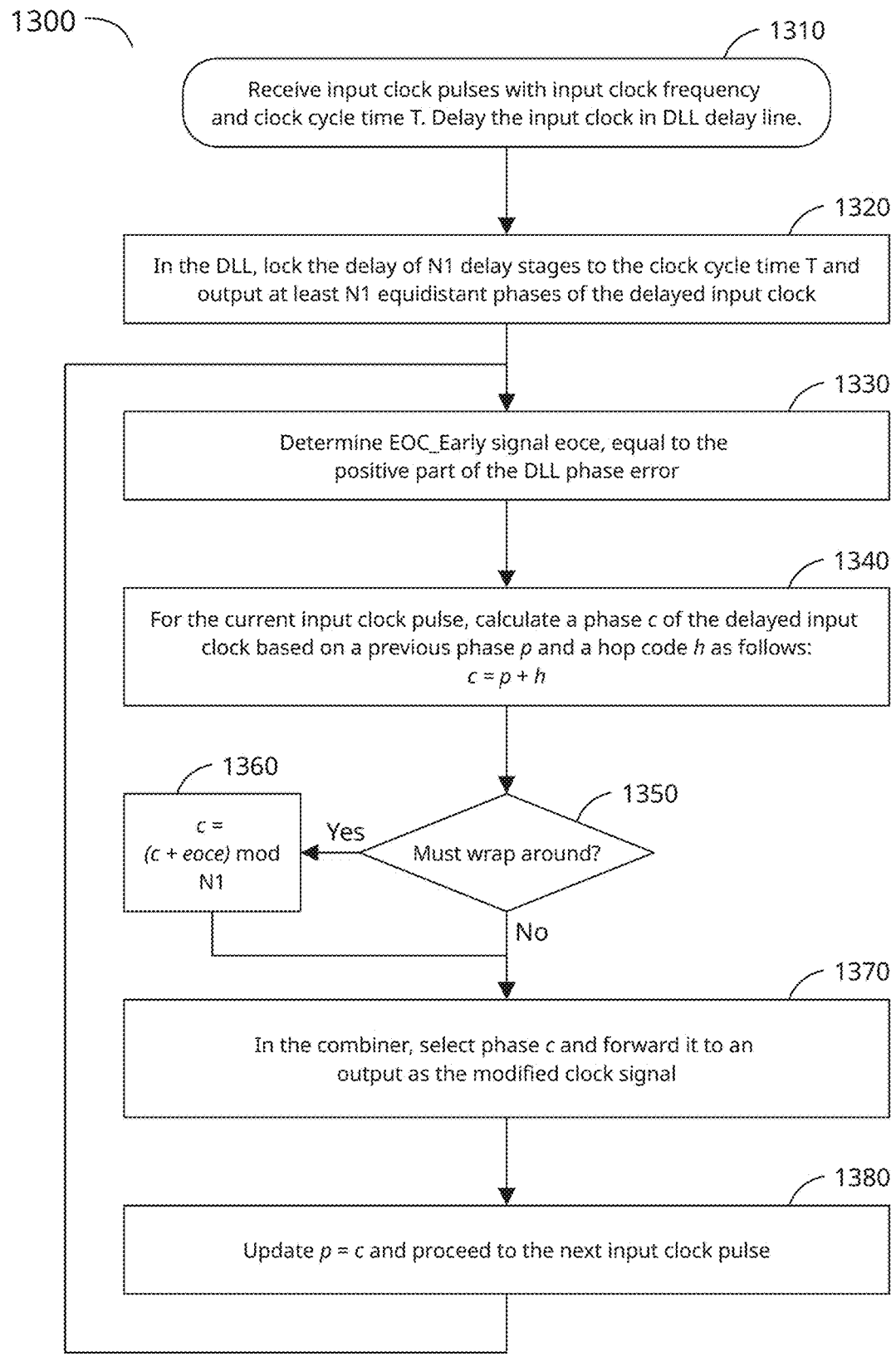
FIG. 13 illustrates a first method to correct glitches due to finite DLL bandwidth in a clock stretcher according to an implementation of the disclosed technology.

FIG. 13 illustrates a first method 1300 to correct glitches due to finite DLL bandwidth in a clock stretcher according to an implementation of the disclosed technology. The clock stretcher may have a general architecture such as clock stretcher 320 in FIG. 5. Method 1300 includes the following steps.

Step 1310—receiving input clock pulses with a fixed frequency and a clock cycle time T, and delaying the input clock pulses in a delay line including delay stages in a DLL. The delay line may have more than N1 stages, and the implementation may select N1 as a suitable delay line length for the fixed frequency of the input clock. The clock pulses may come from a clock generator, for example clock generator 310, or any other source of clock pulses.

Step 1320—in the DLL, locking a delay of N1 delay stages to clock cycle time T and forwarding at least N1 phases of the delayed input clock to a combiner. In the combiner, selecting the first of the N1 phases (clk_0) and forwarding it to the clock stretcher output as the modified clock. Initializing a previously selected phase p as 0. Thus, p=0.

Step 1330—determining an EOC_Early signal eoce. The implementation may first determine the EOC, and calculate the phase error by subtracting EOC from the required length N1. The EOC_Early signal eoce equals the phase error (DLL phase error 955 or DLL phase error 1055) when the phase error is positive, and equals zero otherwise.

Step 1340—for a current input clock pulse, calculating a phase c of the delayed input clock based on a previously selected phase p and a hop code h by adding the hop code h to the previously selected phase p. Thus, c=p+h.

Step 1350—determining if phase selection wraparound must occur by determining if c+eoce exceeds N1−1 (the last of the N1 equidistant phases). The implementation selects phases from clk_0 to clk_N1−1, so after phase clk_N1−1 it must-wrap-around and start at the beginning.

Step 1360—upon determining that phase selection wraparound must occur, adding the EOC_Early signal eoce to obtain the sum of c and eoce, and applying modulo N1 on the sum. Thus, c=(c+eoce) mod N1. This step means that, when the combiner wraps around, the implementation adds the EOC_Early signal eoce to the hop code.

Step 1370—in the combiner, selecting phase c (e.g., clk_c) and forwarding it to the clock stretcher output as the modified clock.

Step 1380—updating the previously selected phase p as c. Thus, p=c. When a next input clock pulse arrives, to the clock stretcher continues with Step 1330.

Method 1300 is based on the clock stretcher architecture of FIG. 5. However, an implementation with small changes can be applied to the architecture of FIG. 4, using input clock 315 for phase clk_0. Also, method 1300 is based on forwarding clk_0 . . . clk_N−1 to the combiner, whereas another implementation may be based on forwarding clk_1 . . . clk_N to the combiner. Any such variations are within the ambit and scope of the present disclosed technology.

Figure 14:
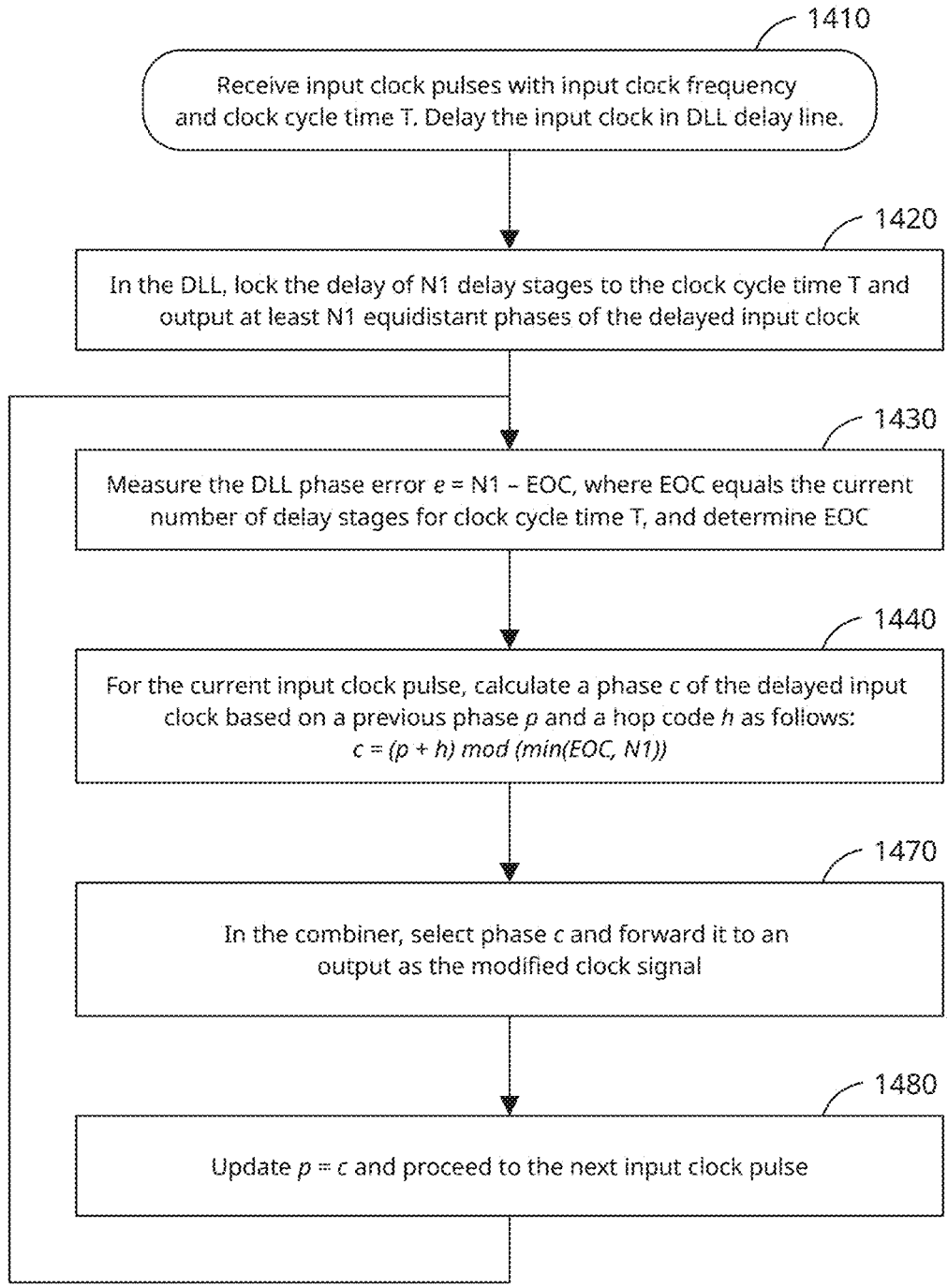
FIG. 14 illustrates a second method to correct glitches due to finite DLL bandwidth in a clock stretcher according to an implementation of the disclosed technology.

FIG. 14 illustrates a second method 1400 to correct glitches due to finite DLL bandwidth in a clock stretcher according to an implementation of the disclosed technology. The clock stretcher may have a general architecture as clock stretcher 320 in FIG. 5. Method 1400 includes the following steps.

Step 1410—receiving input clock pulses with a fixed frequency and a clock cycle time T, and delaying the input clock pulses in a delay line including delay stages in a DLL. The delay line may have more than N1 stages, and the implementation may select N1 as a suitable delay line length for the fixed frequency of the input clock. The clock pulses may come from a clock generator, for example clock generator 310, or any other source of clock pulses.

Step 1420—in the DLL, locking a delay of N1 delay stages to clock cycle time T and forwarding at least N1 equidistant phases of the delayed input clock to a combiner. In the combiner, selecting the first of the N1 equidistant phases (clk_0) and forwarding it to the clock stretcher output as the modified clock. Initializing a previously selected phase p as 0. Thus, p=0.

Step 1430—measuring a DLL phase error e and determining the number of delay stages EOC that span the current clock cycle time T.

Step 1440—for a current input clock pulse, calculating a phase c of the delayed input clock based on a previously selected phase p and a hope code h by adding the hop code h to the previously selected phase p and applying modulus EOC on the result if EOC<N1, or applying modulus N1 on the result otherwise. Thus, c=(p+h) mod min(EOC, N1).

Step 1470—in the combiner, selecting phase c (e.g., clk_c) and forwarding it to the clock stretcher output as the modified clock.

Step 1480—updating the previously selected phase p as c. Thus, p=c. Waiting for a next input clock pulse and returning to Step 1430.

Method 1400 is based on the clock stretcher architecture of FIG. 5. However, an implementation with small changes can be applied to the architecture of FIG. 4, using input clock 315 for phase clk_0. Also, method 1400 is based on forwarding clk_0 . . . clk_N−1 to the combiner, whereas another implementation may be based on forwarding clk_1 . . . clk_N to the combiner. Any such variations are within the ambit and scope of the present disclosed technology.

Both method 1300 and method 1400 depend on the EOC and its difference from N1, which equals the DLL's phase error (DLL phase error 955 or DLL phase error 1055). Normally, a glitch would occur if EOC is less than N1, and a pulse of modified clock 325 would be too short. Both methods compensate for the glitch. Method 1300 compensates while wrapping phase selection around at N1, adding the phase error to the step size (the hop code) if the phase error is positive. Method 1400 compensates by wrapping phase selection around at the smaller of EOC and N1. While the methods are totally equivalent, the control unit circuitry for executing one versus the other is a bit different.

To perform method 1300, the control unit (control circuit 420, control circuit 520, or control circuit 620) uses an EOC_Early signal that equals the DLL phase error if the DLL phase error is positive, and that equals zero otherwise. The control unit may receive the EOC_Early signal from the DLL, or derive it from the phase error, or from N1 and EOC. Thus, the DLL information must include the EOC_Early signal, the phase error, or the EOC. The control unit receives the DLL information and the hop code, as well as the DLL delay line's required length N1. Based on these, it generates a combiner control signal that includes the information for the cyclical selection of N1 delay line phase output signals. The control unit calculates a phase c to be selected by adding the hop code h to a previously selected phase p. It determines if wraparound must occur by comparing c+eoce with N1. If c+eoce>N1−1, then it wraps around by updating phase c to c+eoce mod N1.

To perform method 1400, the control unit uses the EOC signal. The control unit calculates a phase c to be selected by adding the hop code h to a previously selected phase p to obtain a sum, and performing modulo EOC on the sum if EOC is less than N1, or performing modulo N1 otherwise.

Clock Stretcher with Correction for Glitches Due to Phase Detector Offset

A clock stretcher DLL may calculate its EOC for every cycle of input clock 315 and lock input clock 315 clock cycle time T to a required number of N1 delay stages, allowing a change of N1 in runtime. Each of phase detectors 930, DLL 730, and EOC detector 1030 may have an offset, resulting in a steady-state difference between the required length of the chain of delay stages that is synchronized to input clock 315 cycle time T and the actual length. The steady-state difference may be less or more than the delay stage delay time Δt. Thus, phase clk_N1 may be slightly out of sync with clk_0. If phases selected from the end of the delay line are too late, then phase selection wraparound results in an output clock pulse that is too short. This type of glitch jeopardizes the overall functionality of a clock stretcher. Most clocked systems can accept a clock pulse whose cycle time is too long, but not one whose cycle time is too short.

To combat the glitch problem, a first implementation may add an offset skip parameter value os to the hop code whenever wraparound occurs. By hopping to a higher number phase, the shortening of the output pulse is prevented. The offset skip value parameter os may be a programmable value, since the offset is static, and some overcompensation has no critical impact. A user may determine os heuristically, by simulation, or from product characterization results. A second implementation may combat the problem by wrapping around the phase selection at a delay stage lower than N1.

Figure 15:
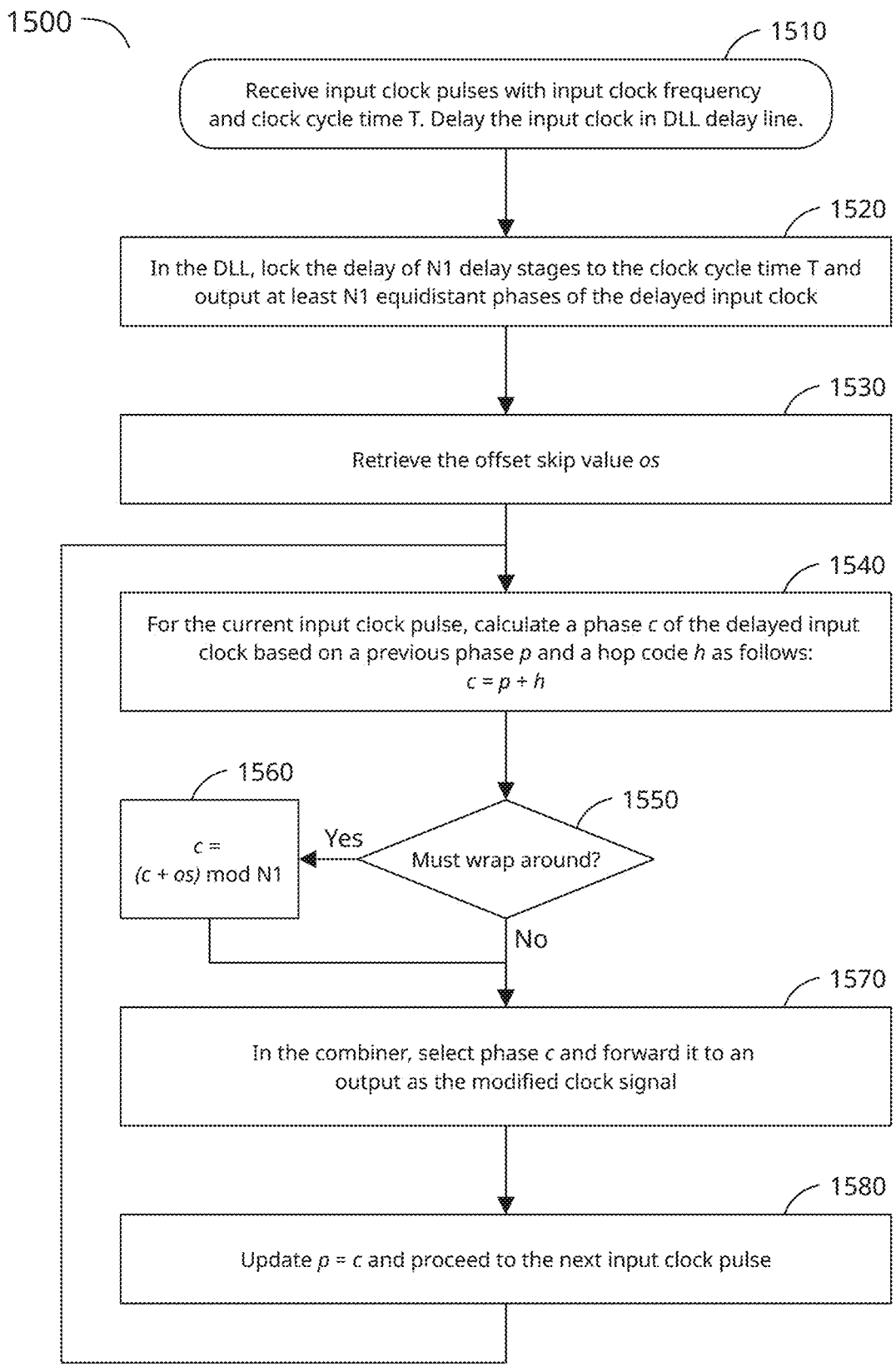
FIG. 15 illustrates a first method to correct glitches due to phase detector offset in a clock stretcher according to an implementation of the disclosed technology.

FIG. 15 illustrates a first method 1500 to correct glitches due to phase detector offset in a clock stretcher according to an implementation of the disclosed technology. The clock stretcher may have a general architecture such as clock stretcher 320 in FIG. 4, FIG. 5, or FIG. 6. Method 1500 includes the following steps.

Step 1510—receiving input clock pulses with a fixed frequency and a clock cycle time T, and delaying the input clock pulses in a delay line including delay stages in a DLL. The clock pulses may come from a clock generator, for example clock generator 310, or any other source of clock pulses.

Step 1520—in the DLL, locking a delay of N1 delay stages to clock cycle time T and forwarding at least N1 equidistant phases of the delayed input clock to a combiner.

In the combiner, selecting the first of the N1 equidistant phases (clk_0) and forwarding it to the clock stretcher output as the modified signal. Initializing a previously selected phase p as 0. Thus, p=0.

Step 1530—retrieving an offset skip value os. The implementation may retrieve the offset skip value os from a memory or a register, or os may be hardwired.

Step 1540—for a current input clock pulse, calculating a phase c of the delayed input clock based on a previously selected phase p and a hop code h by adding the hop code h to the previously selected phase p. Thus, c=p+h.

Step 1550—determining if phase selection wraparound must occur by determining if c is equal to or exceeds the last of the N1 equidistant phase (phase clk_N1−1). The implementation selects phases from clk_0 to clk_N1−1, so after phase clk_N1−1 it must-wrap-around and start at the beginning. Some implementations may determine if phase selection wraparound must occur by determining if c+os is equal to or exceeds N1 (the last of the N1 equidistant phases).

Step 1560—upon determining that phase selection wraparound must occur, adding the offset skip value os to obtain the sum of c and os, and applying modulo N1 on the sum. Thus, c=(c+os) mod N1. This step means that, when the combiner wraps around, the implementation adds the offset skip value os to the hop code.

Step 1570—in the combiner, selecting phase c (e.g., clk_c) and forwarding it to the clock stretcher output as the modified clock.

Step 1580—updating the previously selected phase p as c. Thus, p=c. Waiting for a next input clock pulse and returning to Step 1540.

Figure 16:
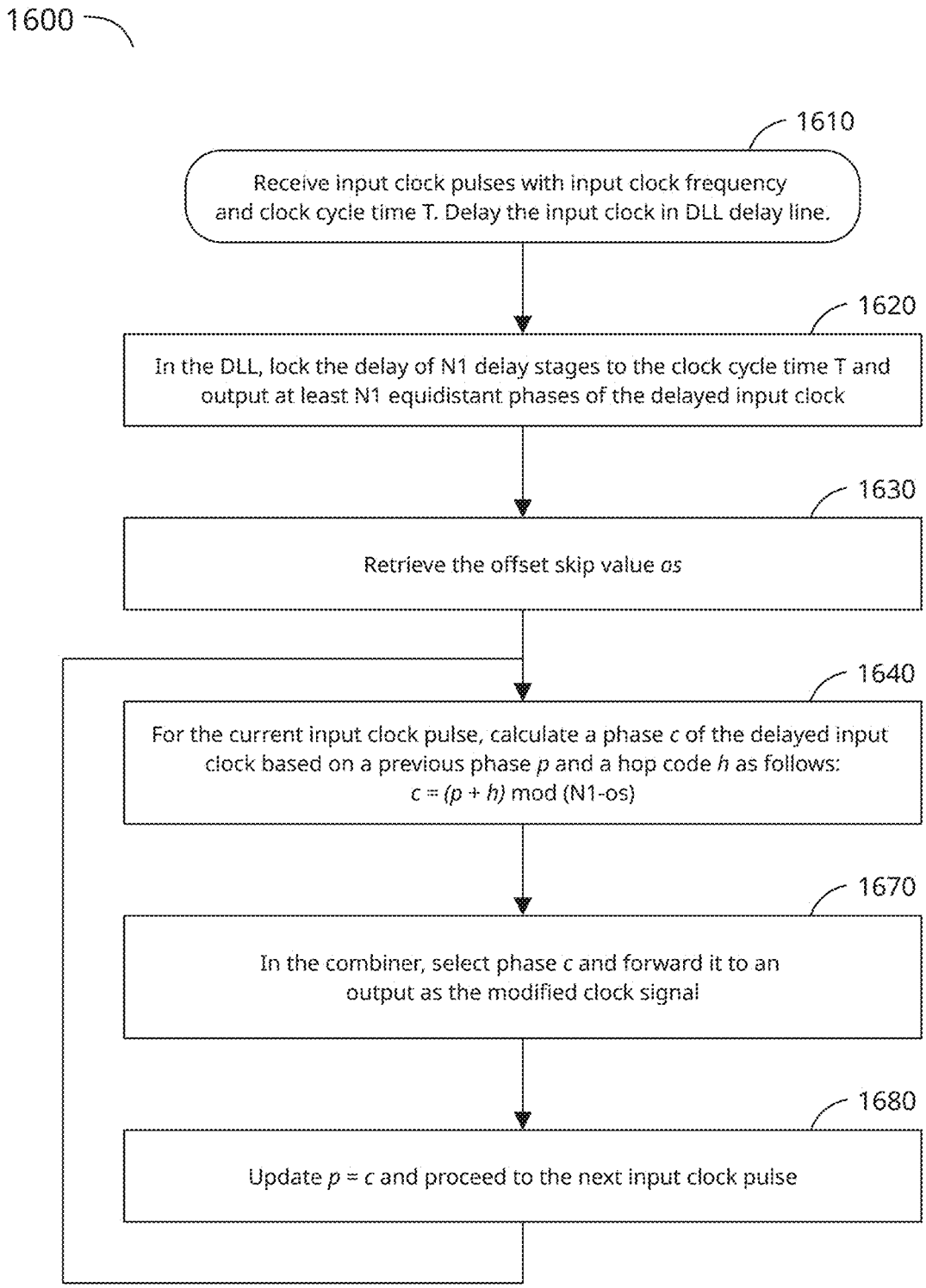
FIG. 16 illustrates a second method to correct glitches due to phase detector offset in a clock stretcher according to an implementation of the disclosed technology.

FIG. 16 illustrates a second method 1600 to correct glitches due to phase detector offset in a clock stretcher according to an implementation of the disclosed technology. The clock stretcher may have a general architecture such as clock stretcher 320 in FIG. 4, FIG. 5, or FIG. 6. Method 1600 includes the following steps.

Step 1610—receiving input clock pulses with a fixed frequency and a clock cycle time T, and delaying the input clock pulses in a delay line including delay stages in a DLL. The clock pulses may come from a clock generator, for example clock generator 310, or any other source of clock pulses.

Step 1620—in the DLL, locking a delay of N1 delay stages to clock cycle time T and forwarding at least N1 equidistant phases of the delayed input clock to a combiner. In the combiner, selecting the first of the N1 equidistant phases (clk_0) and forwarding it to the clock stretcher output as the modified signal. Initializing a previously selected phase p as 0. Thus, p=0.

Step 1630—retrieving an offset skip value os. The implementation may retrieve the offset skip value os from a memory or a register, or os may be hardwired.

Step 1640—for a current input clock pulse, calculating a phase c of the delayed input clock based on a previously selected phase p and a hope code h by adding the hop code h to the previously selected phase p to obtain a sum, and applying modulus (N1−1−os) to the sum. Thus, c=(p+h) mod (N1−1−os).

Step 1670—in the combiner, selecting phase c (e.g., clk_c) and forwarding it to the clock stretcher output as the modified clock.

Step 1680—updating the previously selected phase p as c. Thus, p=c. Waiting for a next input clock pulse and returning to Step 1640.

Clock Stretcher with Correction for Digital DLL Glitches

In the clock stretcher architectures illustrated in FIGS. 4-6, the DLLs may internally use either a continuous-time negative feedback loop or a discrete-time negative feedback loop to synchronize their delay with the incoming pulses of input clock 315. A DLL may calculate its EOC for every cycle of input clock 315 and lock input clock 315 clock cycle time T to a required number of N1 delay stages, allowing a change of N1 in runtime. If the DLL uses a discrete-time negative feedback loop with an internal clock, or if the DLL measures the delay line's delay in discrete steps (the whole number of delay stages) rather than as a continuum (the whole number plus a fraction), then changes to the delay line speed will have a discontinuous character: the delay line will suddenly become a bit faster or a bit slower. A sudden change in speed can result in shortening of a clock stretcher output pulse, a glitch that in many clocked systems can result in a timing violation and functional failure. In a digital DLL, all changes in speed are sudden, and are in sync with the digital DLL's internal clock. The internal clock may drive the DLL's phase comparator, loop filter, and other internal circuits. If the internal clock equals input clock 315, then potentially a glitch may occur for every pulse of input clock 315. If the internal clock has a lower frequency, then the potential glitches occur less often (but the DLL will respond slower to changes in N1 or the EOC). For example, if the internal clock frequency equals one eighth of the input clock 315 frequency, then a glitch may potentially occur on roughly every eighth cycle of the modified clock. One crude way of dealing with the problem is to lengthen the modified clock 325 pulse whenever there is an active edge of the DLL internal clock. But there is not always a speed change at every occurrence of the DLL internal clock, so a better result may be obtained by monitoring the delay line speed control signal at the output of the DLL loop filter. When it changes, there is a speed change that will affect the length of the modified clock 325 pulse. An even better result is obtained by monitoring whether the change at the output of the DLL loop filter will cause the delay line to slow down.

Traditional clock stretchers combat this problem by using a fine resolution delay line (i.e., Δt is short), but that either increases die area and power consumption or shortens the overall input frequency tuning range and limits the usability of the whole module. In contrast, an implementation of the disclosed technology determines when a discontinuity occurs (e.g., when the DLL updates its speed), and ensures that no output clock shortening occurs by hopping one or more additional phases.

Figure 17:
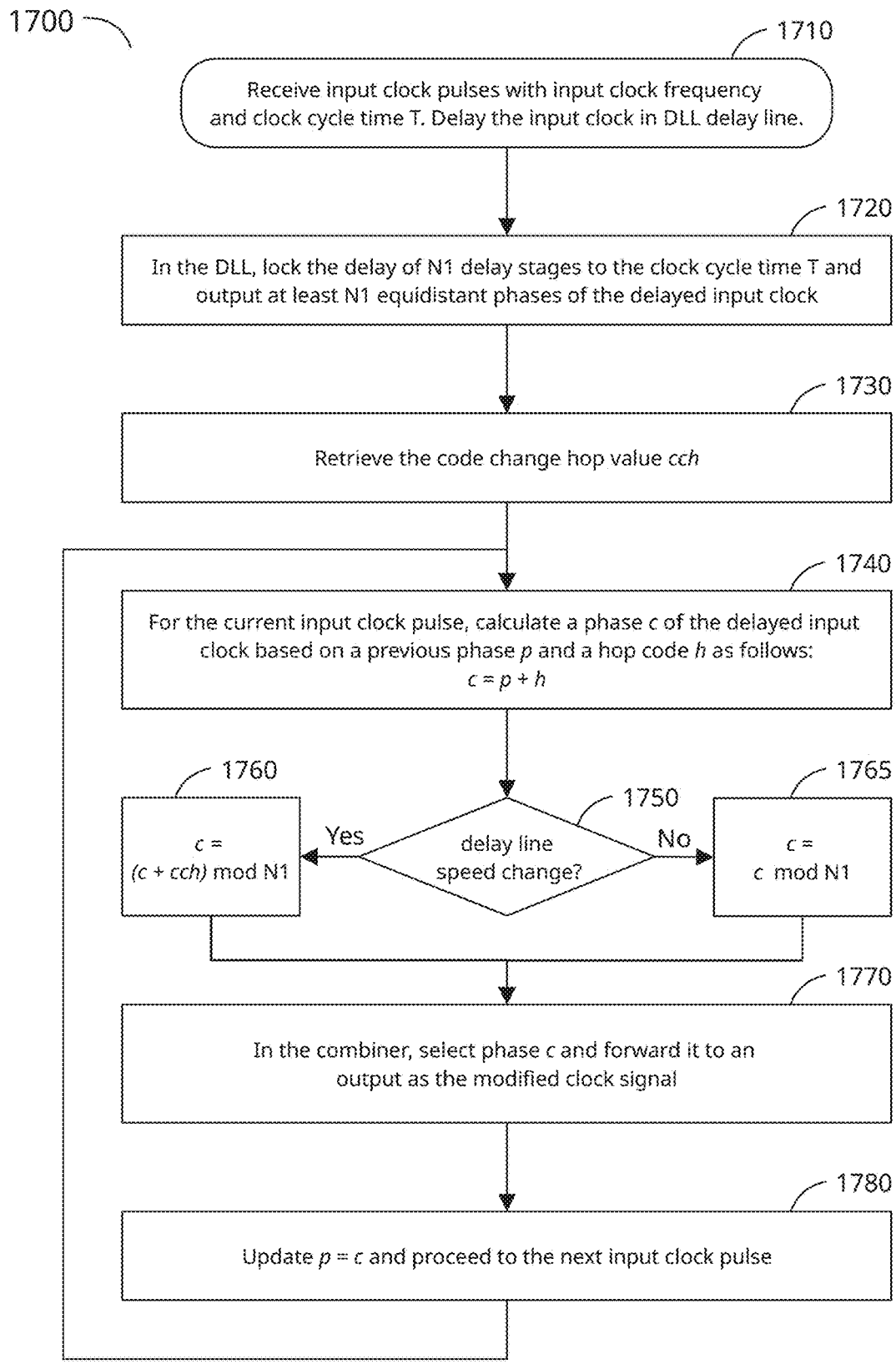
FIG. 17 illustrates a method to correct glitches due to delay line speed discontinuities in a clock stretcher according to an implementation of the disclosed technology.

FIG. 17 illustrates a method 1700 to correct glitches due to delay line speed discontinuities in a clock stretcher according to an implementation of the disclosed technology. The clock stretcher may have a general architecture such as clock stretcher 320 in FIG. 4 or FIG. 5. Method 1700 includes the following steps.

Step 1710—receiving input clock pulses with a fixed frequency and a clock cycle time T, and delaying the input clock pulses in a delay line including delay stages in a DLL. The clock pulses may come from a clock generator, for example clock generator 310, or any other source of clock pulses.

Step 1720—in the DLL, locking a delay of N1 delay stages to clock cycle time T and forwarding at least N1 equidistant phases of the delayed input clock to a combiner. In the combiner, selecting the first of the N1 equidistant phases (clk_0) and forwarding it to the clock stretcher output as the modified signal. Initializing a previously selected phase p as 0. Thus, p=0.

Step 1730—retrieving code change hop value cch. The implementation may retrieve the code change hop value cch from a memory or a register, or cch may be hardwired.

Step 1740—for a current input clock pulse, calculating a phase c of the delayed input clock based on a previously selected phase p and a hop code h by adding the hop code h to the previously selected phase p. Thus, c=p+h.

Step 1750—determining if a change in the delay line speed occurs or may occur. To do so, the clock stretcher's control unit may monitor a DLL internal clock or a delay line speed control signal. Either signal may be included in the DLL information provided by the DLL to the control unit. In some implementations, the DLL updates the delay line speed using the DLL internal clock, and the DLL internal clock's active edges are an indication that a delay line speed change occurs, or may occur. In an implementation, the control unit may determine the sign and amplitude of the delay line speed change and act only for discontinuities where the delay line slows down. Alternatively, an implementation may ignore the sign and amplitude of the delay line speed change and act whenever the delay line speed change may occur. In some implementations, the DLL updates its delay line speed continuously. However, changes may still include a discontinuity if the number of stages locked to is measured as a discrete number. In those cases, the implementation may measure the change, and if the change exceeds a threshold, the implementation acts.

Step 1760—upon determining that a discontinuity in the DLL speed occurs, adding the code change hop value cch to obtain the sum of c and cch, and applying modulo N1 on the sum. Thus, c=(c+cch) mod N1.

Step 1765—upon determining that no discontinuity in the DLL speed occurs, applying modulo N1 on c. Thus, c=c mod N1.

Step 1770—in the combiner, selecting phase c (e.g., clk_c) and forwarding it to the clock stretcher output as the modified clock.

Step 1780—updating the previously selected phase p as c. Thus, p=c. Waiting for a next input clock pulse and returning to Step 1740.

Clock Stretcher with Passive Mode Jitter Reduction

A clock stretcher DLL may calculate its EOC for every cycle of input clock 315 and lock input clock 315 clock cycle time T to a required number of N1 delay stages of the DLL delay line, allowing a change of N1 in runtime. Delay lines built from a chain of logic gates, such as inverters or NAND gates, may suffer from jitter due to device and other noise. The noise increases with the number of stages that a clock pulse travels through. As a result, a delay line output phase near the end (near clk_N) has more jitter than near the beginning (near clk_0). The jitter may be undesirable in the clocked system since it makes timing closure more difficult, which could lead to a lower maximum clock frequency.

When a conventional clock stretcher changes from stretching mode (reducing the clock frequency) to passive mode (modified clock 325 has the same frequency as input clock 315), it stops hopping selected phases of the input clock and proceeds to continuously pass the same phase to the clock stretcher output, regardless of its position in the delay line.

An implementation has an architecture such as in FIG. 4, FIG. 5, or FIG. 6. It has a passive mode and a stretching mode. In the passive mode, it forwards input clock pulses to the clock stretcher output, wherein the input clock pulses are delayed by fewer than 10 delay stages of the DLL delay line. For example, it may bypass the DLL and forward input clock 315 directly to combiner circuit 440 or bypass multiplexer 642. In an alternative example, it may select clk_0 or another phase output of the DLL delay line that is delayed by fewer than 10 delay stages from the input clock 315 input signal. This allows for a limited offset between input clock 315 and the phase selected for potentially longer terms as the passive-mode output signal, such that jitter is limited.

To enter passive mode, implementations do not suddenly stop hopping when the hop code changes to zero. Instead, they may continue hopping until a passive mode entry threshold is reached. The passive mode entry threshold may depend on whether the implementation forwards clk_0 or uses a bypass. If in passive mode it forwards clk_0, the passive mode entry threshold comprises phase selection reaching the beginning of the delay line, i.e., phase clk_0. If in passive mode it uses a bypass, the passive mode entry threshold is met earlier, to compensate for offset between input clock 315 and phase clk_0. This offset may be represented by a bypass skip (bs) parameter.

To facilitate continued hopping before entering passive mode, an implementation may use a minimum hop parameter mh. Applying the minimum hop value warrants that during stretching mode the phase selection does not get stuck somewhere along the delay line, but keeps progressing towards the phase selection wraparound point N1.

Figure 18:
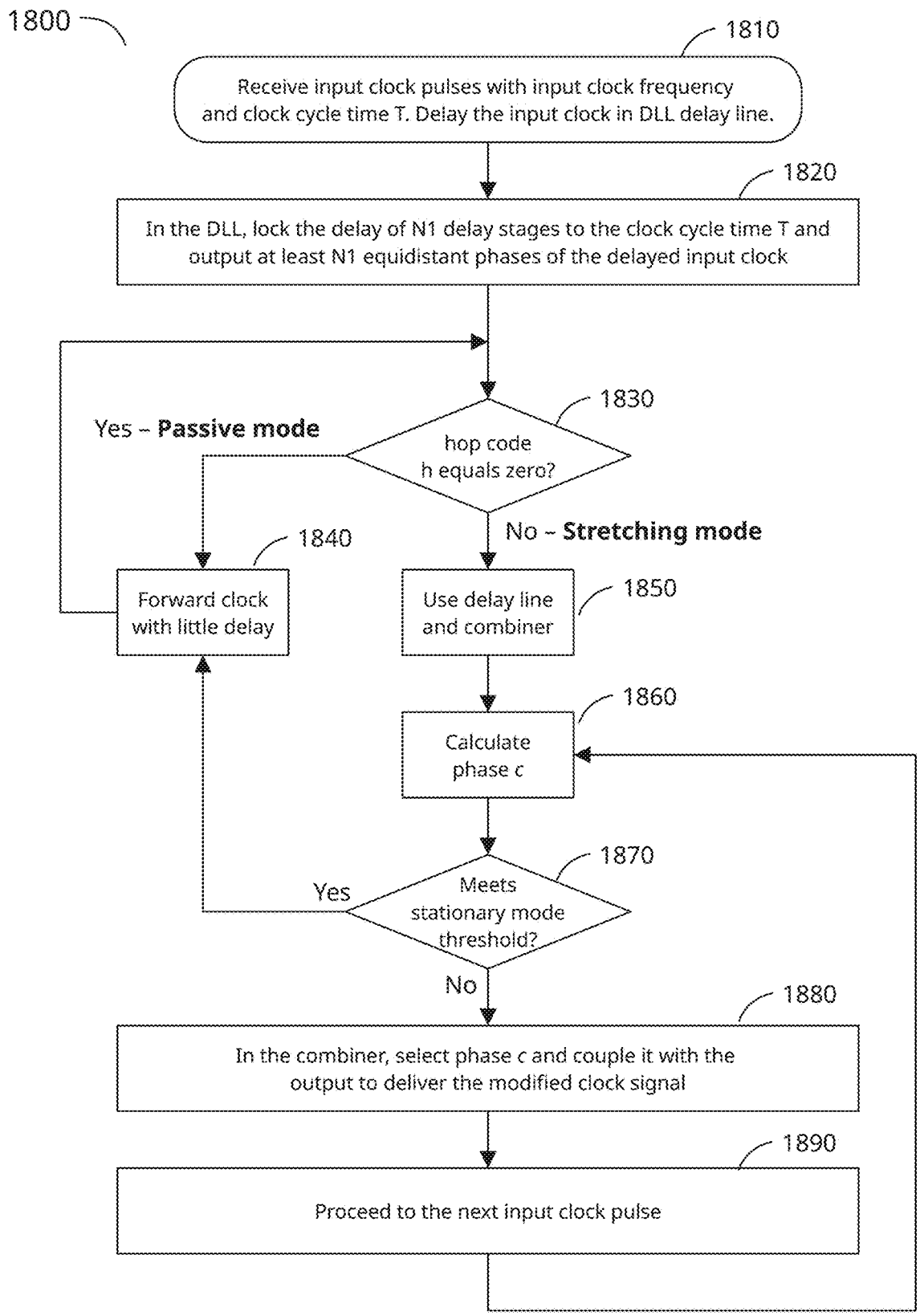
FIG. 18 illustrates a method to prevent output jitter in a clock stretcher in passive mode according to an implementation of the disclosed technology.

FIG. 18 illustrates a first method 1800 to prevent output jitter in a clock stretcher in passive mode according to an implementation of the disclosed technology. The method bypasses the delay line when in passive mode and deals with offset between clk_0 and the input clock at the delay line input. The clock stretcher may have a general architecture such as clock stretcher 320 in FIG. 6. The clock stretcher receives input clock pulses with a clock cycle time T on an input and delivers pulses of a modified clock on an output. Method 1800 comprises the following steps.

Step 1810—receiving input clock pulses with a fixed frequency and a clock cycle time T, and delaying the input clock pulses in a delay line including delay stages in a DLL. The clock pulses may come from a clock generator, for example clock generator 310, or any other source of clock pulses.

Step 1820—in the DLL, locking a delay of N1 delay stages to clock cycle time T and forwarding at least N1 equidistant phases of the delayed input clock to a combiner. In the combiner, selecting the first of the N1 equidistant phases (clk_0) and forwarding it to the clock stretcher output as the modified signal. Initializing a previously selected phase p as 0. Thus, p=0. The implementation may also retrieve values for the minimum hop value mh and, if applicable, the bypass skip value bs.

Step 1830—retrieving the hop code h and determining if it equals zero. Upon determining that the hop code h equals zero, entering passive mode and proceeding with Step 1840. Upon determining that the hop code h does not equal zero, entering stretching mode and proceeding with Step 1850.

Step 1840—forwarding input clock pulses to the clock stretcher output, wherein the input clock pulses are delayed by fewer than 10 delay stages of the DLL delay line. An implementation with a bypass couples input clock 315 with combiner circuit 440 or with bypass multiplexer 642. An implementation without a bypass selects clk_0, or a phase output close to clk_0 and fewer than 10 delay stages of the DLL delay line from the delay line input, and forwards it via the combiner to the clock stretcher output. The implementation is in passive mode, during which no changes to phase selection need to occur, and returns to Step 1830.

Step 1850—delaying the input clock pulses in a delay line including delay stages in the DLL; and in the DLL, locking a delay of N1 delay stages to clock cycle time T and forwarding N1 equidistant phases of the delayed input clock to the combiner.

Step 1860—calculating a phase c based on a previously selected phase p, the hop code h, and the minimum hop code value mh. The phase c equals p plus mh if the hop code h equals zero. Otherwise, the phase c equals (p+h) modulus N1.

Step 1870—determining if phase c meets the passive mode entry threshold. The threshold includes two conditions. The first condition is that the hop code h must equal zero. In an implementation that selects clk_0, the second condition is that phase c is equal to or larger than N1. In an implementation that bypasses the delay line, the second condition is that phase c plus bypass skip value bs is equal to or larger than N1. Upon meeting the passive mode entry threshold, the implementation proceeds to Step 1840.

Step 1880—in the combiner, selecting phase c (e.g., clk_c) and forwarding it to the clock stretcher output as the modified clock. The combiner selects the delay line output associated with clk_c and couples it with the clock stretcher output to deliver the modified clock.

Step 1890—updating the previously selected phase p as c. Thus, p=c. Waiting for a next input clock pulse and returning to Step 1860.

Variable-Length Clock Stretcher with Combiner Timing Logic

Figure 19:
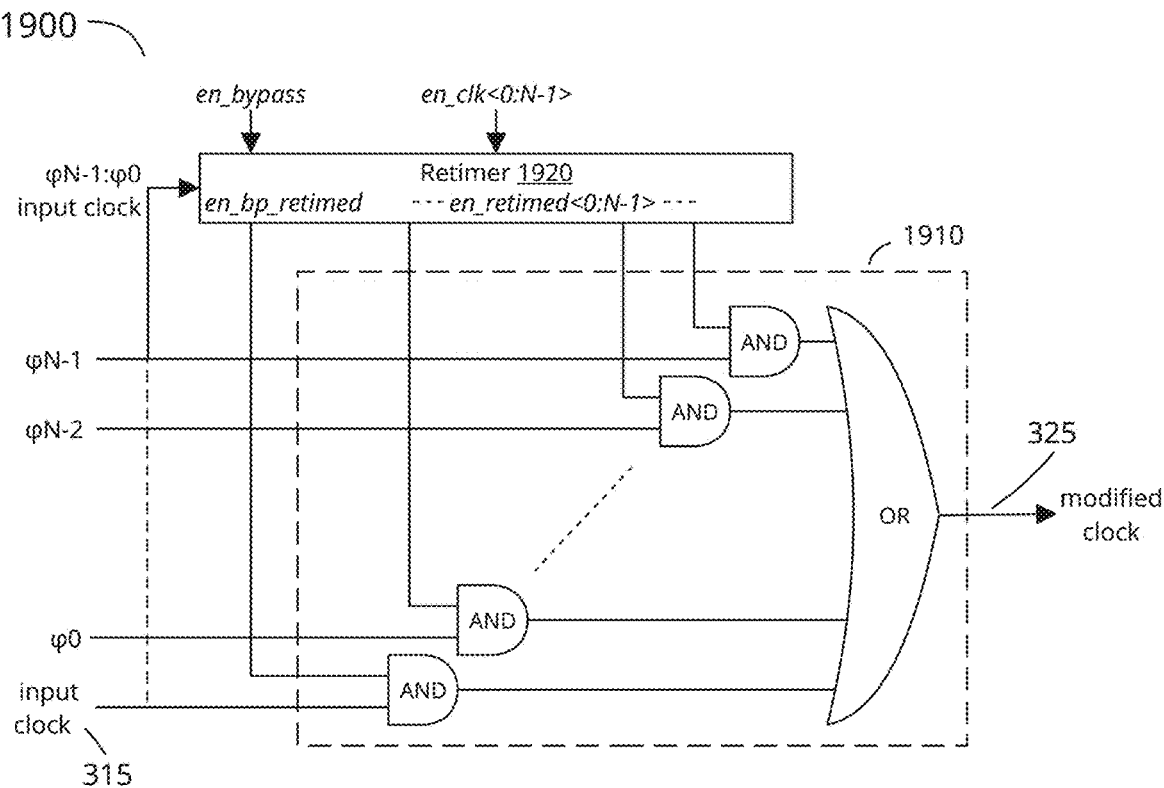
FIG. 19 illustrates a combiner according to an implementation of the disclosed technology.

FIG. 19 illustrates a combiner 1900 according to an implementation of the disclosed technology. Combiner 1900 includes combinatorial logic 1910 and retimer 1920. Retimer 1920 has a first input for a bypass enable signal en_bypass, second inputs for phase enable signals en_clk<0:N−1> (whose mth signal is en_clk_m), a third input for input clock 315, fourth inputs for delayed phase signals φ0 . . . φN−1, a first output for a retimed bypass enable signal en_bp_retimed, and second outputs for retimed phase enable signals en_retimed<0:N−1> (whose mth signal is en_retimed_m). Combinatorial logic 1910 has a first input for en_bp_retimed, coupled with the retimer first output, second inputs for en_retimed<0:N−1> coupled with the retimer second outputs, a third input for input clock 315, fourth inputs for the delayed phase signals φ0 . . . φN−1, and an output for modified clock 325.

Retimer 1920 receives combiner control signals from control circuit 420 or control circuit 520, including en_bypass to enable bypass mode, and en_clk<0:N−1>, which determines which of the phase signals φ0 . . . φN−1 must be forwarded to the clock stretcher output for modified clock 325. All outputs of retimer 1920 are coupled with inputs of combinatorial logic 1910. The delayed clock phases are also denoted herein as clk_0 . . . clk_N−1. Combinatorial logic 1910 forwards clk_m to modified clock 325 if the corresponding enable signal en_retimed_m is asserted. In some implementations, such as in combiner 1900, combinatorial logic 1910 will simultaneously forward multiple phases if multiple corresponding phase enable signals are simultaneously asserted. Example logic shown to accomplish this is simple, using N+1 2-input AND gates and one (N+1)-input OR gate. However, implementations may use any combinatorial logic to achieve this functionality. For example, a silicon compiler generating a netlist for standard CMOS logic implementation is likely to use mainly NAND and/or NOR gates with 2 or 4 inputs. The implementation in FIG. 19 supports the timing illustrated in FIGS. 11-12.

The reason to include retimer 1920, and its function, will be described with reference to FIGS. 20-22. The signals en_clk<0:N−1> may come from an address decoder in the control unit or a binary-to-1-hot encoder (such as binary to 1-hot encoder 824) that takes the phase address information and outputs one line per phase. The line en_clk_m for phase clk_m is asserted when phase clk_m must be forwarded to modified clock 325, and deasserted at all other times.

However, the control unit may be clocked by input clock 315, so that en_clk_m is aligned with input clock 315 instead of with modified clock 325. Retimer 1920 delays the enable signals en_clk_m to generate en_retimed_m as needed, and also generates en_bp_retimed from en_bypass.

Figure 20:
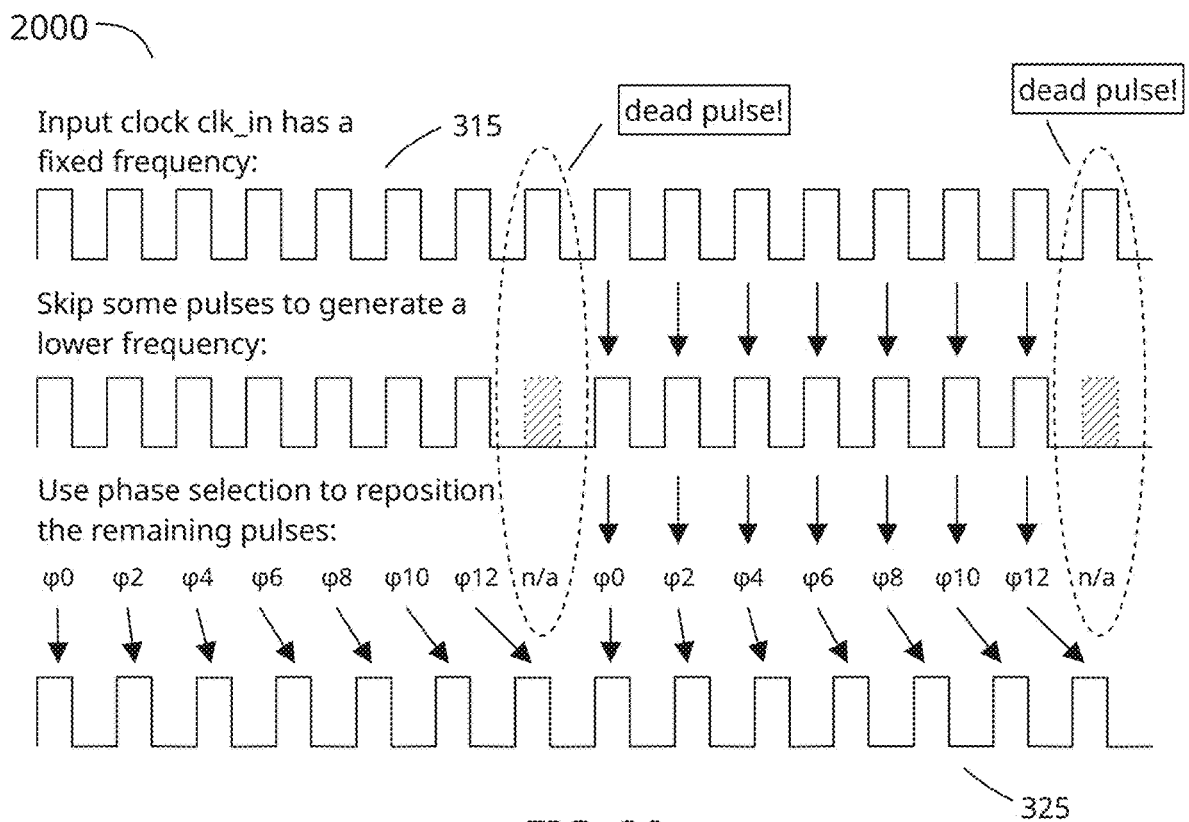
FIG. 20 illustrates clock stretching timing of a clock stretcher according to an implementation of the disclosed technology.

FIG. 20 illustrates clock stretching timing 2000 of a clock stretcher according to an implementation of the disclosed technology. The clock stretcher receives an input clock clk_in with a fixed frequency (input clock 315 the first signal drawn). The clock stretcher generates a stretched clock, with a lower frequency (modified clock 325), by regularly skipping an input clock pulse (the second signal drawn for clarity, but it does not need to occur in an actual implementation), and repositioning (retiming) the remaining clock pulses so that they appear at regular intervals (the third signal drawn). To reposition these remaining clock pulses, the clock stretcher uses the DLL delay line, which outputs N successively delayed phases φ0 . . . φN−1, and the combiner, which cyclically selects pulses of the output signal (modified clock 325) from the delayed phases, using the hop code which determines the cyclical step size. For example, if the delay line has an effective length N1=14 and the hop code h equals 2, then the clock stretcher skips 1 out of every 8 clock pulses and repositions the remaining 7 clock pulses, so that modified clock 325 has 14 clock pulses for every 16 clock pulses of input clock 315.

As drawn, the implementation skips an input clock pulse whenever a cyclical wraparound occurs (phase selection goes from φ12 to φ0). The skipped input clock pulse ("dead pulse") does not end up in modified clock 325. The first seven input clock pulses in the example each accompany a signal en_clk_m (in this case, en_clk_0, en_clk_2, en_clk_4, en_clk_6, en_clk_8, en_clk_10, and en_clk_12 for φ0, φ2, φ4, φ6, φ8, φ10, φ12, respectively), but the dead pulse doesn't.

The same principles can also be used for squeezing a clock and increasing its frequency. An implementation may regularly insert (i.e., repeat) a clock pulse, and reposition (retime) surrounding clock pulses to make room for it and to make the clock pulses appear at regular intervals. In such implementations, there is no dead pulse, but a double-used pulse.

Control circuit 420, control circuit 520, or control circuit 620 may deliver combiner control signals (en_bypass and en_clk_m) that are aligned with input clock 315. However, the respective combiner needs such signals to be aligned with modified clock 325. Since the combiner creates modified clock 325, it cannot use modified clock 325 to create modified clock 325. Instead, it uses the available phases to retime the enable signals for somewhat later phases.

The signal en_bypass (FIG. 7) must have an active edge before the input clock 315 active edge, and the signal en_clk_m (with m from 0 to N−1) must have an active edge before the clk_m active edge. Should an implementation not take care of this, then any variation in the timing of the enable signals could adversely impact the timing of the modified clock 325.

FIG. 21 illustrates an example 2100 of over-critical timing of the signal en_bypass that enables input clock 315 to bypass the DLL. In this example, input clock 315 (clk_in) has a clock cycle of duration T, and its rising edge is its active edge. The signal en_bypass also has a duration T, and its rising edge (its active edge) coincides with a input clock 315 active edge. Its falling edge coincides with the next input clock 315 active edge. The signal en_bypass is generated in the control unit, and in sync with clk_in. If en_bypass would directly be used to enable clk_in, then any variation in the timing of the rising edge or falling edge of en_bypass could adversely affect the output signal modified clock 325.

To prevent this undesirable situation, an implementation includes the retimer, such as retimer 1920 in combiner 1900, to create an enable signal with ample margin, en_bp_retimed, from en_bypass. Similarly, it takes input signals en_clk_m (where m=0 . . . N−1), and retimes these to en_retimed_m.

FIG. 22 illustrates an example 2200 of safe timing of the signal en_bp_retimed that enables input clock 315 to bypass the DLL. This example fixes the problems in FIG. 21 by significantly delaying en_bp_retimed from en_bypass, so that both its active edge and its inactive edge precede the following input clock 315 active edges by a minimum safe margin Δt. More generally, if the delay between en_bypass and en_bp_retimed is larger than T/2+Δt and smaller than T−Δt, then by using en_bp_retimed instead of en_bypass, the implementation is no longer sensitive to minor variations in timing of either en_bypass or en_bp_retimed. The only penalty is a delay of one cycle of input clock 315. The integer delay is no issue if all signals have this delay. The safe timing range can be restated in terms of the number of delay stages. If the DLL is synchronized to an active length of N1 stages, i.e., clk_N1=clk_0, then a delay larger than N1/2+1 stages and smaller than N1−1 stages provides a margin Δt of at least 1 unit delay (the nominal delay of a logic gate).

An implementation may derive this delay in two ways. In a direct way, as will be shown in FIG. 23, the implementation may retime en_bypass using input clock 315 delayed by more than N1/2+1 stages and less than N1−1 stages. The safest retiming is achieved with a delay of 0.75*N1 stages (including wire delays). In an indirect way, as will be shown in FIG. 24, the implementation may retime en_bypass using an inverse of input clock 315 delayed by more than 1 stage and less than N1/2−1 stages. In this way, if wire delays are included, the safest retiming is achieved with a delay of 0.25*N1 stages.

FIG. 23 illustrates an example direct retimer circuit 2300 to generate a retimed bypass enable signal according to an implementation of the disclosed technology. Direct retimer circuit 2300 includes first flipflop 2310 and second flipflop 2320. First flipflop 2310 may be included in the synchronous logic in the control unit of FIGS. 4-6, and it is clocked by the input clock 315. Second flipflop 2320 may be included in the combiner circuit. At the output of first flipflop 2310 is the signal en_bypass, synchronized with clk_in. Second flipflop 2320 resynchronizes the signal with a delayed clock to generate en_bp_retimed. The combiner has at least N−1 different delayed clocks at its disposal, but only the DLL's active length N1 is relevant. For example, a DLL with 32 delay stages may be used for active lengths from 24 to 30 stages. In that case, a delayed clock must have a minimum delay of 13 stages (N1=24) or 16 stages (N1=30). The delayed clock must have a maximum delay of 23 stages (N1=24), or 29 stages (N1=30). To support any N1 from 24 to 30 stages, all conditions must be met, so the minimum delay equals 16 stages (from N1=30) and the maximum delay equals 23 stages (from N1=24). Since many signals must be retimed, and wiring of the circuit's physical layout also introduces delays, an implementation may choose a somewhat lower delay from the DLL delay line. For example, if wiring delays are comparable to the delay of three delay stages, an implementation may choose from the range of 13 to 20 stages from the delay line itself (clk_13 to clk_20).

FIG. 24 illustrates an example indirect retimer circuit 2400 to generate a retimed bypass enable signal according to an implementation of the disclosed technology. Indirect retimer circuit 2400 includes first flipflop 2410 and second flipflop 2420. First flipflop 2410 may be included in the synchronous logic in the control unit of FIGS. 4-6, and is clocked by the input clock 315. Second flipflop 2420 may be included in the combiner circuit. At the output of first flipflop 2410 is the signal en_bypass, synchronized with clk_in. Second flipflop 2420 resynchronizes the signal with an inverted delayed clock to generate en_bp_retimed. Some implementations may include an inverter (not drawn) between the clock input of second flipflop 2420 and an input for a delayed clock signal. A delayed clock equals an inverted delayed clock that comes N1/2 stages earlier or later. Thus, in the example where N1 can vary from 24 to 30, the minimum delay should be 1 stage (regardless of the value of N1) and the maximum delay should be 11 stages (for N1=24) or 14 stages (for N1=30). Thus, for generating en_bp_retimed with indirect retimer circuit 2400, the inverted delayed clock should have a delay of more than 1 and less than 11 stages. As mentioned previously, part of this delay may come from the DLL delay line, and part may come from wiring delays.

For the signals en_retimed_m, derived from en_clk_m, an implementation applies the same reasoning. For each of the delayed clock phases clk_0 . . . clk_N−1, the purpose of the retimer is to make sure that en_retimed_m rises earlier (by more than one gate delay) than clk_m, and that en_retimed_m falls earlier (by more than one gate delay) than the next clk_m. The retimer may retime directly (using a delayed input clock signal) or indirectly (using an inverted delayed input clock signal). In another implementation, a retimer may retime in a hybrid model, using any combination of inverted and non-inverted delayed clocks.

FIG. 25 illustrates an example hybrid retimer 2500 to generate any retimed signal needed in an implementation. Hybrid retimer 2500 includes first flipflop 2510, followed by a series of flipflops 2520 (flipflops 2 and K have been drawn). First flipflop 2510 may be included in the synchronous logic in the control unit of FIGS. 4-6, and is clocked by the input clock 315. The series of flipflops 2520 counts one or more flipflops, and may be included in the combiner circuit. At the output of first flipflop 2510 is the signal en_clk_m, synchronized with clk_in (input clock 315). At the output of the last of the series of flipflops 2520 is the signal en_retimed_m. Each flipflop in the series of flipflops 2520 is clocked by one of the delayed clocks clk_0 . . . clkN−1, or clk_in, each of which may be inverted or non-inverted. The last of the series of flipflops 2520 determines with which delayed clock (or its inverse) the output signal will be synchronized. Each earlier of the series of flipflops 2520 adds a condition that must be satisfied.

Each of the flipflops in the series of flipflops 2520 waits for an active or inactive edge of a delayed clock or of the input clock. For a signal to propagate from en_clk_m to en_retimed_m, each of the respective active or inactive edges must have followed the clk_in active edge, and in the correct order. It will be shown with reference to FIG. 26 that this allows retiming any enable pulse in an implementation.

FIG. 26 illustrates an example table 2600 with retiming parameters used in an implementation of the disclosed technology. Table 2600 lists the input signal, i.e. the output signal of first flipflop 2510 in FIG. 25, in the first column. In the second column it lists the name of the output signal to be generated. In this example implementation, the delay line has a maximum length of 32 delay stages. The active length N1 may vary between 24 and 30 stages. Each delay stage provides an input signal clk_m for the combiner, where m=0 . . . 31. The input enable signals en_clk_m are synchronized with clk_in (input clock 315) and need to be retimed to en_retimed_m, suitable for enabling clk_m in the combiner. The implementation retimes using flipflops FF2 . . . FF5, i.e. up to 4 flipflops, in the configuration shown in FIG. 25.

As an example, table 2600 shows that en_retimed_0 is derived from en_clk_0 using just a single flipflop (FF2), which is clocked by the inactive edge of clk_3. Thus, when en_clk_0 goes from inactive to active, the implementation waits for an inactive edge of clk_3 before asserting en_retimed_0. When subsequently en_clk_0 goes from active to inactive, the implementation waits for another inactive edge of clk_3 before de-asserting en_retimed_0. In another example, en_retimed 9 is retimed from en_clk_9 using two flipflops (FF2 and FF3). FF2 is asserted and deasserted by the inactive edge of clk_in, and FF3 is asserted and deasserted by the active edge of clk_3. Thus, when en_clk_9 goes from inactive to active, the implementation waits for an inactive edge of clk_in before asserting FF2, and subsequently for an active edge of clk_3 before asserting en_retimed 9. When en_clk_9 goes from active to inactive, the implementation waits for an inactive edge of clk_in before deasserting FF2, and subsequently for an active edge of clk_3 before deasserting en_retimed 9. In yet another example, en_retimed 28 is derived from en_clk_28 using a chain of 4 flipflops. FF5 is asserted (and deasserted) by the active edge of clk_23, however, only in case the active edge of clk_23 is preceded by active edges of clk_7, clk_19, and clk29, respectively. The series of flipflops FF2 . . . FF5 makes it possible to set detailed conditions for the generation of a retimed signal.

It can also be seen from table 2600 that in some implementations adjacent clock phases can be enabled using the same retiming. For example, in table 2600, en_retimed_13 uses the same retimer configuration as en_retimed_12, but a different input signal (en_clk_13 instead of en_clk_12). In all, this implementation uses only 16 different retimer configurations for 32 enable signals. As discussed before, when the retimed signals en_retimed_m are selected to be noncritical, an implementation with somewhat different selected parameters for FF2 . . . FF5 may generate slightly different timing for en_retimed_m, but will result in the same outcome for modified clock 325.

Figure 27:
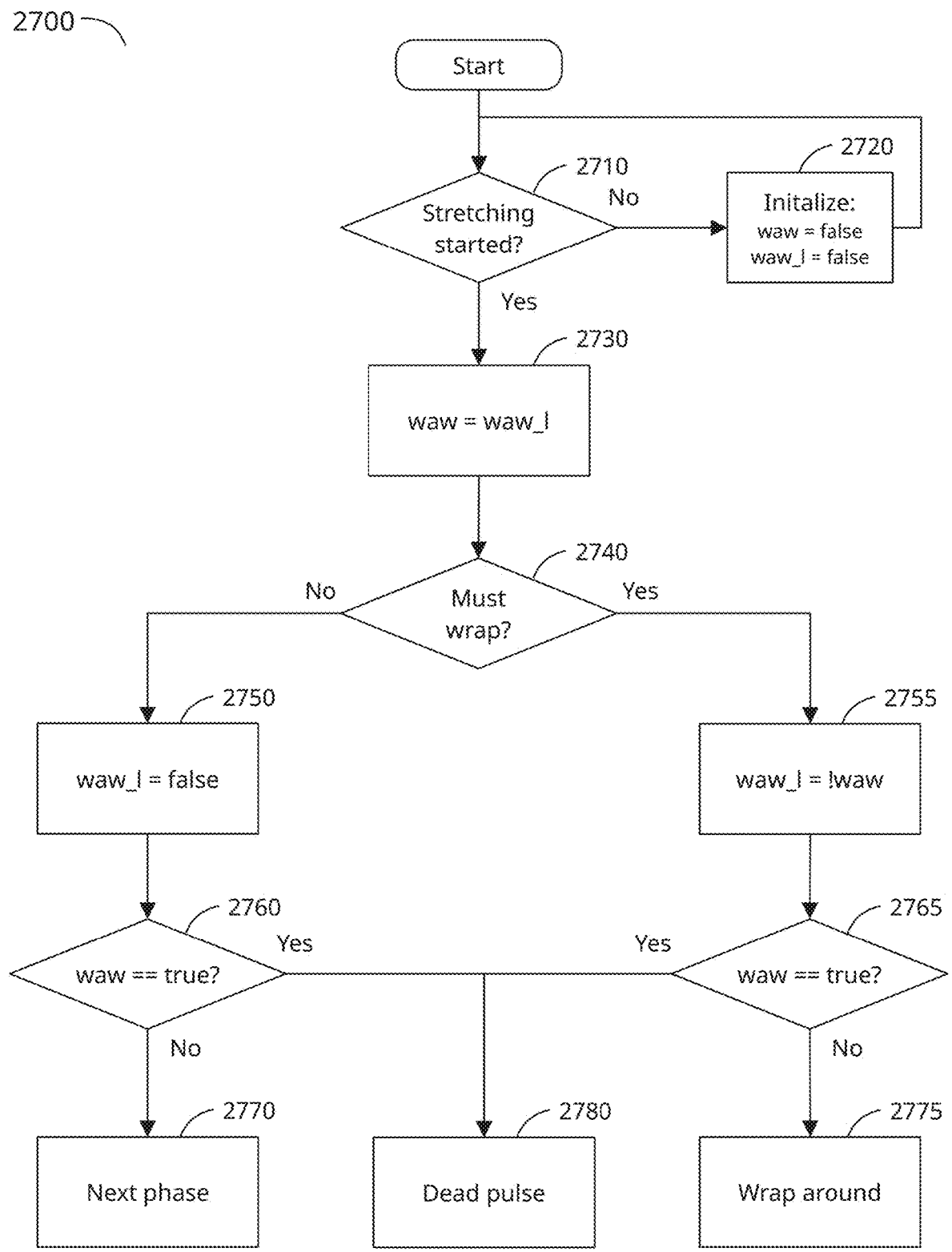
FIG. 27 illustrates a method to determine enablement of a next phase according to an implementation of the disclosed technology.

FIG. 27 illustrates a method 2700 to determine enablement of a next phase according to an implementation of the disclosed technology. Method 2700 may be performed by the control unit, and an implementation performs method 2700 for each cycle of the input clock 315. The method determines when the control logic delivers an enable signal en_clk_m, in accordance with any of the methods previously described herein, or a dead pulse (i.e., all signals en_clk<0:N−1> are false). Method 2700 comprises the following steps.

Step 2710—determining if stretching has started. For example, stretching may have started when a hop code is larger than zero, and the implementation is not in bypass mode (en_bypass=false). However, if the implementation is in bypass mode (en_bypass=true), and/or the hop code equals zero, then stretching may not have started.

Step 2720—upon determining that stretching has not started, initializing parameters waw (where waw=wraparound wait) and waw_1 to false and returning to Step 2710 to wait for a next cycle of input clock 315. An implementation may further assert bypass mode (en_bypass=true) and de-assert all phase selection enable signals en_clk<0:N−1>.

Step 2730—upon determining that stretching has started, updating the parameter waw to equal the parameter waw_1.

Step 2740—determining if wraparound must occur. An implementation may determine this by any of the methods previously described herein, or, generally, if a phase selection address clk_addr (see FIG. 8) plus the hop code equals or is larger than the delay line active length N1.

Step 2750—upon determining that no wraparound must occur, setting the parameter waw_1 to false and proceeding to Step 2760.

Step 2755—upon determining that wraparound must occur, setting the parameter waw_1 to an inverse of the parameter waw and proceeding to Step 2765.

Step 2760—determining if the parameter waw is true. If no, proceeding to Step 2770. If yes, proceeding to Step 2780.

Step 2765—determining if the parameter waw is true. If no, proceeding to Step 2775. If yes, proceeding to Step 2780.

Step 2770—enabling the next phase signal based on the hop code, without wraparound. The method may determine an index m of the next phase signal by adding the hop code to an index of the current phase signal. The method may, for a next cycle of input clock 315, return to Step 2710.

Step 2775—enabling the next phase signal based on the hop code, with wraparound. The method may determine an index m of the next phase signal by adding the hop code to an index of the current phase signal and subtracting the delay line active length N1. The method may, for a next cycle of input clock 315, return to Step 2710.

Step 2780—wrapping around without enabling a phase signal. The method may, for a next cycle of input clock 315, return to Step 2710.

Considerations

The technology disclosed can be practiced as a system or method. One or more features of an implementation can be combined with the base implementation. Implementations that are not mutually exclusive are taught to be combinable. One or more features of an implementation can be combined with other implementations. This disclosure periodically reminds the user of these options. Omission from some implementations of recitations that repeat these options should not be taken as limiting the combinations taught in the preceding sections—these recitations are hereby incorporated forward by reference into each of the following implementations.

Although the description has been described with respect to particular implementations thereof, these particular implementations are merely illustrative, and not restrictive. The description may reference specific structural implementations and methods, and does not intend to limit the technology to the specifically disclosed implementations and methods. The technology may be practiced using other features, elements, methods and implementations. Implementations are described to illustrate the present technology, not to limit its scope, which is defined by the claims. Those of ordinary skill in the art recognize a variety of equivalent variations on the description above. For example, although the described implementations sense a supply voltage, other implementations may alternatively or additionally sense a temperature. They may also take the implementation's innate speed into account, such as determined by manufacturing conditions. An IC's maximum speed is generally determined by its PVT parameters: Process (manufacture), Voltage (e.g., the supply voltage), and Temperature. The figures outline three DLL architectures that are suitable for implementations of the disclosed technology, but many more are known in the art. Any DLL capable of synchronizing a clock to a programmable delay line length may be suitable.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Although the description has been described with respect to particular implementations thereof, these particular implementations are merely illustrative, and not restrictive. For instance, many of the operations can be implemented on a printed circuit board (PCB) using off-the-shelf devices, in a System-on-Chip (SoC), application-specific integrated circuit (ASIC), programmable processor, or in a programmable logic device such as a field-programmable gate array (FPGA), obviating a need for at least part of the dedicated hardware. Implementations may be as a single chip, or as a multi-chip module (MCM) packaging multiple semiconductor dies in a single package. All such variations and modifications are to be considered within the ambit of the present disclosed technology the nature of which is to be determined from the foregoing description.

Any suitable technology for manufacturing electronic devices can be used to implement the circuits of particular implementations, including CMOS, FinFET, BiCMOS, bipolar, JFET, MOS, NMOS, PMOS, HBT, MESFET, etc. Different semiconductor materials can be employed, such as silicon, germanium, SiGe, GaAs, InP, GaN, SiC, graphene, etc. Circuits may have single-ended or differential inputs, and single-ended or differential outputs. Terminals to circuits may function as inputs, outputs, both, or be in a high-impedance state, or they may function to receive supply power, a ground reference, a reference voltage, a reference current, or other. Although the physical processing of signals may be presented in a specific order, this order may be changed in different particular implementations. In some particular implementations, multiple elements, devices, or circuits shown as sequential in this specification can be operating in parallel.

It will also be appreciated that one or more of the elements depicted in the drawings/figures can also be implemented in a more separated or integrated manner, or even removed or rendered as inoperable in certain cases, as is useful in accordance with a particular application.

Thus, while particular implementations have been described herein, latitudes of modification, various changes, and substitutions are intended in the foregoing disclosures, and it will be appreciated that in some instances some features of particular implementations will be employed without a corresponding use of other features without departing from the scope and spirit as set forth. Therefore, many modifications may be made to adapt a particular situation or material to the essential scope and spirit.

We claim as follows:

1. A clock stretcher circuit, comprising:
a delay line that receives an input clock on a first input and that outputs a series of delayed phases of the input clock;
a control circuit that receives the input clock on a first input, that receives a hop code signal and a stretch enable signal on second inputs, and that in response to the hop code signal and the stretch enable signal generates and outputs a bypass enable signal on a first output and a series of delayed-phase enable signals on second outputs;
a combiner circuit that receives the series of delayed phases from the delay line and the bypass enable signal and the series of delayed-phase enable signals from the control circuit, that retimes the delayed-phase enable signals to overlap corresponding delayed phases from the delay line, and that outputs a modified clock on a combiner output based on coupling a delayed phase from the delay line with the combiner output in response to a corresponding delayed-phase enable signal;
wherein:
is the control circuit is clocked by the input clock; and
the combiner circuit retimes a first delayed-phase enable signal for a first delayed phase using a flipflop clocked by a second delayed phase to generate a retimed phase enable signal.

2. The clock stretcher circuit of claim 1, wherein the control circuit executes a method comprising the following steps:
(a) in response to the hop code signal and the stretch enable signal, generating a bypass enable signal and a currently-stretching signal;
(b) in response to a currently-stretching signal that is deasserted, deasserting a waw_l signal, and returning to step (a);
(c) in response to a currently-stretching signal that is asserted, setting a waw register value to true if the waw_l signal is asserted and setting the waw register value to false if the waw_l signal is deasserted;
(d) generating a must-wrap-around signal;
(e) upon determining that the must-wrap-around signal is deasserted, deasserting the waw_l signal and proceeding to step (g);
(f) upon determining that the must-wrap-around signal is asserted, asserting the waw_l signal and proceeding to step (h);
(g) if the waw register value is false, then proceeding to step (i); else, proceeding to step (k);
(h) if the waw register value is true, then proceeding to step (j); else, proceeding to step (k);
(i) determining an index of a next phase without wrap-around, enabling the next phase to deliver a pulse of the modified clock on the combiner output, and returning to step (a) for a next pulse of the input clock;
(j) determining an index of the next phase with wrap-around, enabling the next phase to deliver the pulse of the modified clock on the combiner output, and returning to step (a) for a next pulse of the input clock; and
(k) wrapping around and returning to step (a) for a next pulse of the input clock.

3. The clock stretcher circuit of claim 2, wherein generating the must-wrap-around signal comprises:
determining if a phase address index plus the hop code signal equals or is larger than an active delay line length;

in response to determining that the phase address index plus the hop code signal equals or is larger than the active delay line length, asserting the must-wrap-around signal; and in response to determining that the phase address index plus the hop code signal is less than the active delay line length, deasserting the must-wrap-around signal.

4. The clock stretcher circuit of claim 1, wherein step (b) further comprises de-asserting phase selection enable signals and asserting a bypass mode.

5. The clock stretcher circuit of claim 1, wherein the combiner circuit comprises:

a retimer circuit with a first input for a bypass enable signal, second inputs for phase enable signals, a third input for an input clock signal, fourth inputs for delayed phase signals, a first output for a retimed bypass enable signal, and second outputs for retimed phase enable signals;

a combinatorial logic circuit with a first input for the retimed bypass enable signal, coupled with the retimer first output, second inputs for the retimed phase enable signals coupled with the retimer second outputs, a third input for the input clock signal, fourth inputs for the delayed phase signals coupled with the retimer fourth inputs, and an output for a modified clock signal; wherein:

upon receiving the retimed bypass enable signal, the combinatorial logic circuit passes the input clock signal to the output for the modified clock signal;

upon receiving a retimed phase enable signal, the combinatorial logic passes a delayed phase signal to the output for the modified clock signal; and the retimer circuit comprises a bypass flipflop with a data input coupled with the retimer first input, a data output coupled with the retimer first output, and a clock input coupled with a retimer fourth input to receive a delayed phase signal that triggers the bypass flipflop.

6. The clock stretcher circuit of claim 5, further comprising:

an inverter between the bypass flipflop clock input and a combinatorial logic fourth input, operable to invert a delayed phase signal.

7. The clock stretcher circuit of claim 5, further comprising:

a series of flipflops, each with a data input, a data output, and a clock input, wherein a first flipflop data input is coupled with a second retimer input to receive a phase enable signal and a last flipflop data output is coupled with a second retimer output to deliver a retimed phase enable signal, and wherein each flipflop in the series of flipflops has its clock input coupled with a combinatorial logic fourth input to receive a delayed phase signal that triggers the flipflop.

8. The clock stretcher circuit of claim 7, wherein a flipflop in the series of flipflops has its clock input coupled with the combinatorial logic fourth input via an inverter that inverts the delayed phase signal.

* * * * *